(12) United States Patent
Shizukuishi

(10) Patent No.: US 6,717,190 B2
(45) Date of Patent: Apr. 6, 2004

(54) SOLID-STATE IMAGE PICK-UP DEVICE

(75) Inventor: Makoto Shizukuishi, Kurokawa-gun (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/366,672

(22) Filed: Feb. 14, 2003

(65) Prior Publication Data

US 2003/0151075 A1 Aug. 14, 2003

(30) Foreign Application Priority Data

Feb. 14, 2002 (JP) .................................... P.2002-036727
Feb. 14, 2002 (JP) .................................... P.2002-036728

(51) Int. Cl.[7] ..................... H01L 27/148; H01L 29/768
(52) U.S. Cl. ..................... 257/232; 257/233; 257/240
(58) Field of Search ..................... 257/232, 231, 257/233, 240

(56) References Cited

U.S. PATENT DOCUMENTS 5,306,906 A  *  4/1994  Aoki et al. ............... 250/208.1
5,341,008 A  *  8/1994  Hynecek ..................... 257/231
6,236,434 B1     5/2001  Yamada
6,528,831 B2 *  3/2003  Umetsu et al. ............. 257/233

FOREIGN PATENT DOCUMENTS

JP       2001-223352 A     8/2001

* cited by examiner

Primary Examiner—Ngân V. Ngô
(74) Attorney, Agent, or Firm—Birch, Stewart, Kolasch & Birch, LLP

(57) ABSTRACT

A honeycomb CCD, whose light receiving portion and a certain light receiving portion 105 adjoining thereto are arranged at a position to be shifted by half a pixel pitch in line and row directions, has charge transfer electrodes 111–114 formed of double-layered polysilicon electrode, a metal wiring 125, having smaller resistivity thereto, which is arranged in the longitudinal direction along each VCCD to intersect and cross over the charge transfer electrodes 111–114 being connected by a contact hole 126, by which electrical resistance of the polysilicon layer of the charge transfer electrodes can be lowered without increasing thickness thereof.

20 Claims, 21 Drawing Sheets

SOLID-STATE IMAGE PICK-UP DEVICE

BACKGROUND OF THE INVENTION

1. Field of the Invention

The present invention relates to a solid-state image pick-up device, and particularly to the structure of a signal charge transfer electrode in the image pick-up apparatus.

2. Description of the Related Art

When the image pick-up of a still image is conducted by an electronic still camera, a solid-state image pick-up device of all pixel (progressive) reading system is appropriate as an image pick-up device, rather than the system so-called interlaced scanning which is corresponding to a standard television signal.

In the conventional interline transfer type charge coupled device (hereinafter, called IT-CCD), as shown in FIG. 20, an image pick-up device of the checker board arrangement in which a light receiving portion 51 having an embedded photodiode composed of P type low density impurity area (P-well), N type high density impurity layer 51a, and P type high density impurity layer 51b of the surface is widely used. In order to conduct the all pixel reading in the IT-CCD, at least 3 electrodes (3 phase transfer pulse $\phi1$, $\phi2$, and $\phi3$) is necessary per one pixel. Therefore, in the IT-CCD of the all pixel reading type of the IT-CCD, triple layered polysilicon electrode structure polysilicon having the first layer 61, second layer 62, and third layer 63 is adopted for the charge transfer electrode, and an electrode wiring area between pixels is reduced as small as possible, and that is realized.

In the IT-CCD, the electrode wiring area in the row direction of each light receiving portion as mentioned above, is a space for the wiring of polysilicon electrode, and in order not to sacrifice the sensitivity, it is required that its width is reduced as narrow as possible. When the width of the electrode wiring area is reduced, the width of the polysilicon electrode is also reduced, and the electric resistance of the charge transfer electrode is increased. Accordingly, conventionally, the width of the polysilicon electrode of this electrode wiring area is reduced, and inversely, the electrode thickness is increased to cancel out the increase of the electrical resistance. In general, the thickness of the polysilicon electrode is about 0.4 $\mu$m–0.7 $\mu$m, and the electrical resistance of the transfer electrode is reduced to the allowable level. However, when the film thickness of the polysilicon electrode is increased, it might bring about another problem. in its lithography process, thus increasing the thickness of the electrode is somewhat limited one. In the future, when the increase of the pixels (for example, more than 5000×10³) or the increase of the CCD image size (APS size or 135 size) advances, due to such electrical resistance of the polysilicon charge transfer electrode, it becomes difficult for the high charge transfer efficiency to be maintained during the charge transfer process.

Further, by using the progressive solid-state image pick-up device, a full electronic shutter capability is realized in which any mechanical component is not required. In the case of such a full electronic shutter, the light is always on the solid-state image pick-up device, which is not experienced in the case of the mechanical shutter being used, it is important to suppress a smear (the bleeding of the light which appears in the image in the row direction when the high luminance object such as the sun is photographed). In order to reduce the smear level, as shown in FIG. 21, a frame interline transfer type CCD (hereinafter, called FIT-CCD) is developed. The FIT-CCD has another CCD portion 54 which stores the electronic charges from the light receiving area 53. The charge storage portion 54 where the incoming light is shielded, is provided on the adjoining area of the light receiving area 53 in which a light receiving portion 51 and a charge transfer electrode 52 are arranged. In such the FIT-CCD, by quickly moving the charge to the storage area 54, the reduction of smear is conducted. Therefore, because the high speed charge transfer in the VCCD is required, the reduction of the resistance of the charge transfer electrode corresponding to the high speed driving is necessary.

In order to reduce the electrical resistance of the charge transfer electrode in the IT-CCD, other than the case where the thickness of the polysilicon electrode is increased, it is considered that the dopant density of phosphorus or arsenic in the polysilicon electrode is increased and the resistivity is reduced. However, in this method, even when the dopant density is increased more than the solubility limit of the impurity element, because the resistivity is not enough reduced, in the same manner as the case of the increase of the thickness, there is a limit in the correspondence of the increase of the pixels, increase of the size, or the high speed driving. Accordingly, as another method to reduce the electrical resistance of the charge transfer electrode, the structure in which a backing metallic wiring, so called metallic backing is over-coated on the polysilicon electrode as disclosed in JP-A-2001-223352, is proposed.

When the metallic backing is provided on the IT-CCD, as shown in FIG. 22, it is the structure in which the metallic wiring 55 is extended in the vertical row direction on the upper portion of the VCCD charge transfer electrode 52 and through the contact hole 56, the metallic wiring 55 is electrically connected to the polysilicon electrode of each phase. In such a IT-CCD, there remains only limited room for the layout arrangements for both the metallic wiring and the contact hole by which the metallic wiring and the polysilicon electrode are electrically connected. Further, in the charge transfer electrode of the of triple layered polysilicon structure of the progressive IT-CCD, triple layered electrodes are vertically folded between the light receiving portions of 51 in the row direction, which becomes difficult to expose enough area of each electrode for the electrical contact with the metallic backing being provided on every polysilicon electrode layer.

As described above, in the conventional IT-CCD, in order to reduce the electrical resistance of a charge transfer electrode, the method in which the thickness of a polysilicon electrode is increased, or the dopant density of phosphorous or arsenic in the polysilicon electrode is increased, is adopted, but, by these methods, it is difficult to meet further requirements such as increase of pixels, increase of the chip size or the high charge transfer speed. Further, when the metallic backing is used, in its structure in the IT-CCD, the given room is limited for the layouts of the metallic wiring and the contact hole where the metalic wiring and the polysilicon electrode are electrically connected, and lithography/process for increasing the density of the pixels becomes difficult. Particularly, in the charge transfer electrode of the triple layered polysilicon structure by which all pixels can be read, it is difficult to provide the metallic backing on every polysilicon electrode.

SUMMARY OF THE INVENTION

The present invention is attained in view of the above circumference, and the object of the present invention is to provide with a solid-state image pick-up device, more specifically IT-CCD, such that although integration of the device becomes much more high density, the equivalent electrical resistance of the charge transfer electrode can be reduced to achieve high speed transfer of the electric charge.

Referring to the drawings, embodiments of the present invention will be described below. FIG. 1 is a view showing the outline structure of a CCD image pick-up device used for the embodiment of the present invention. In the present embodiment, so called honeycomb arrangement CCD image pick-up device (hereinafter, called honeycomb CCD) is used as the IT-CCD in the image pick-up area (light receiving area) provided with the light receiving portion composed of the photoelectric conversion devices such as photodiodes. The pixel arrangement of the light receiving portion of said honeycomb CCD is arranged such that the light receiving portion adjoining a certain light receiving portion is arranged at a position at which a half of the pixel pitch of the line and row directions is shifted. The detailed structure of the honeycomb CCD is disclosed in U.S. Pat. No. 6,236,434.

According to one aspect of this invention, a solid-state image pick-up device is comprised of: a plurality of light receiving portions which are arranged in a line direction at a predetermined pitch and in a row direction perpendicular thereto on a semiconductor substrate, said plurality of light receiving portions being arranged such that a pixel, which is corresponding to a light receiving portion, and another pixel, which is adjacent to said pixel and corresponding to another light receiving portion, being relatively shifted by half a pixel pitch in the line direction and the row direction; a vertical charge transfer portion having a vertical charge transfer path which adjoins the light receiving portions extending in the row direction, in which the electric charge generated in the light receiving portions is transferred, and a charge transfer electrodes composed of a polysilicon electrodes extending in the line direction so as to cover the vertical charge transfer path and supply a transfer pulse for controlling a potential of the vertical charge transfer path; a metal wiring which is provided corresponding to each electrode in the upper portion of the charge transfer electrodes, said metal wiring extending along the vertical charge transfer portion in the row direction; and a contact portion by which each of the polysilicon electrodes and the metal wiring are electrically connected.

According to further aspect in this invention, each of said charge transfer electrodes are composed of double layered polysilicon electrodes.

According to another aspect in this invention, each of said charge transfer electrodes is formed in such a manner that four polysilicon electrodes, corresponding to one light receiving portion, are split into two sets of two polysilicon electrodes so as to surround the light receiving portion, and the metal wiring is provided corresponding to each of the polysilicon electrode.

According to another feature in this invention, the charge transfer electrodes supply and drive the transfer pulse of 4 n phases, said n being an integer larger than 1.

In still further aspect in this invention, the metal wiring is structured in such a manner that it extends to at least one direction of the extended line direction, and a plurality of metal wirings are extended to both directions of the line direction, where they are connected to a supply source of the transfer pulse.

According to a favorable embodiment in this invention, the contact portion is formed in an area along the longitudinal direction of the metal wiring or the polysilicon electrodes.

According to yet another aspect in this invention, the contact portion is formed on a device separation area by which the adjoining vertical charge transfer paths are separated.

Further, in this invention, in one end portion of an image pick-up area including the light receiving portion and the vertical charge transfer portion, an storage portion storing the charge transferred from the vertical charge transfer portion is provided.

Still further, in this invention, the charge transfer electrodes have a separation portion by which the light receiving portions is electrically separated per one pixel in the line direction thereof, every two sets of the light receiving portions in the row direction being driven independently each other.

Yet still further, in this invention, the charge transfer electrode have a separation portion by which the light receiving portions is electrically separated per two pixels in the line direction thereof, every four sets of the light receiving portions in the row direction being driven independently each other.

In this invention, the metal wiring is connected to one of the charge transfer electrodes in such a manner that the transfer pulse to transfer the charge in a direction in the vertical charge transfer portion is supplied for a corresponding set of the row-aligned light receiving portions, wehrein said direction is opposite in an adjacent set of the row-aligned light receiving portions that is separated by the separation portion.

In this invention, the storage portions storing a respective charge transferred by the vertical charge transfer portion are provided on both end portions of the image pick-up area including the light receiving portion and the vertical charge transfer portion.

In this invention, the metal wiring is structured by the same wiring material so that the vertical charge transfer portion is driven by the same transfer pulse in the image pick-up area and the storage portion.

In this invention, the metal wiring is structured by Al, W, Cu, Ti, Co, Ni, Pd, Pt, or nitride of them, silicide, alloy, compound, or complex.

In this invention, thickness of the polysilicon electrode is no more than 0.25 $\mu$m.

In this invention, an insulating film is provided between the polysilicon electrode and the metal wiring, thickness of the insulating film being no more than 0.2 $\mu$m.

DESCRIPTION OF THE PREFERRED EMBODIMENTS

Figure 1:
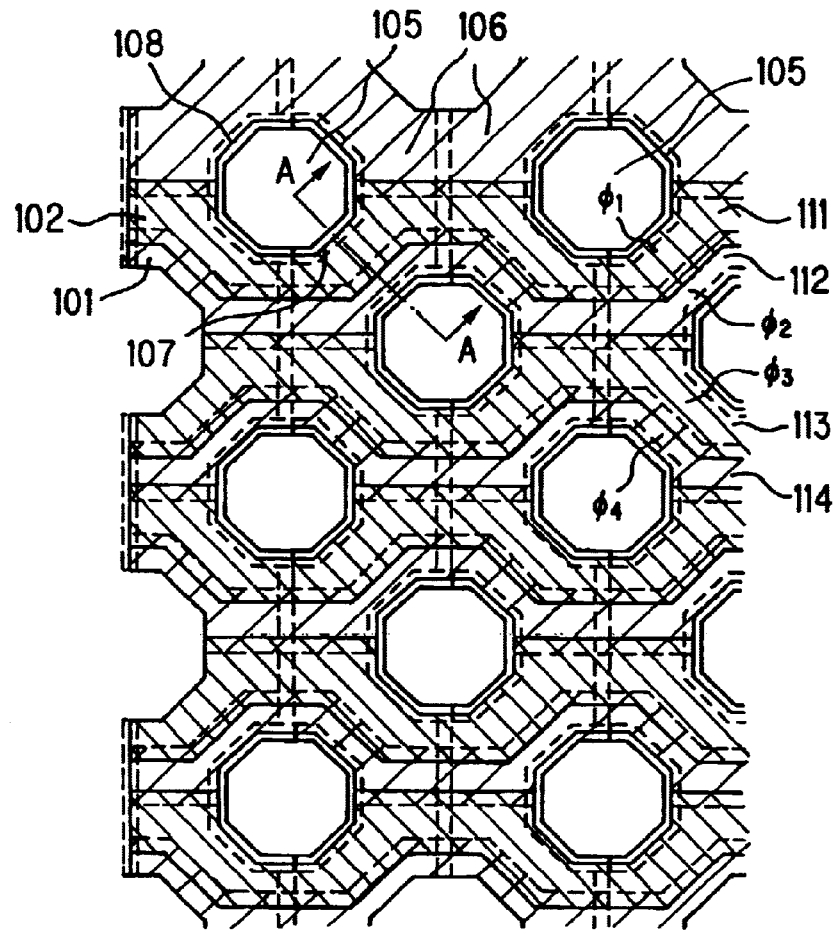
FIGS. 1(A) and 1(B) show the views showing the outline structure of a honeycomb CCD used for the first embodiment of the present invention, where (A) is a plan view, and (B) is an A—A sectional view.
Figure 1:
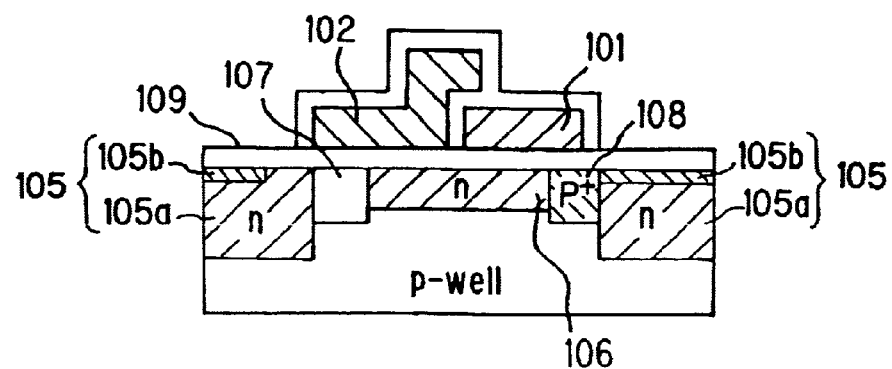

The light receiving portion 105 is arranged in the situation in which a half of the pixel pitch is relatively shifted in the horizontal line and vertical row directions to the adjoining light receiving portion. That is, in a certain light receiving area, the light receiving portions are adjacently arranged at the central point positions of the checkerboard which is formed in the horizontal line and vertical row directions. Thereby, the image pick-up area where the light receiving portions are arranged is structured in such a way that the checkerboard having a pitch of $1/\sqrt{2}$ of the pixel pitch in the horizontal line and vertical row directions is inclined by 45°.

These light receiving portions 105 are structured by an embedded photodiode formed of a P type low density impurity material area (P-well), N type high density impurity material layer 105a, and P type high density impurity material layer 105b of the surface. In the adjoining area of the periphery of the light receiving portion 105, a charge transfer path 106 is formed by the N type high density impurity material to transfer the stored charge in the light receiving portion 105. Further, the charge transfer path 106 is formed in a winding shape which is extending in the vertical row direction on the drawing. In the upper portion of the charge transfer path 106, the charge transfer electrodes 111, 112, 113 and 114 are formed by the double-layered structure polysilicon electrodes including the first layer 101 and second layer 102. The doubled-layered polysilicon electrode is formed in such a manner that, after the first layer 101 is formed, the second layer 102 is formed on the insulating film with which the end portion of the first layer 101 is overlapped. By these charge transfer electrodes 111, 112, 113, and 114, for example, the transfer pulse of 4 phases of $\phi1$, $\phi2$, and $\phi3$, and $\phi4$ is added and the charge transfer path 106 is driven, thus all pixel reading can be performed.

On one end portion of the outer periphery of the light receiving portion 105, a gate 107 is provided to read out the charge stored by the photoelectric conversion into the charge transfer path 106. On the other side potion, a device separation area (or channel stop) 108 is formed by the P type high density impurity material, which stops the charge so as not to flow on the charge transfer path of the adjoining pixel row over the upper and lower direction. Further, on each surface of the light receiving portion 105 and charge transfer path 106, the first layer polysilicon electrode 101, and the second layer polysilicon electrode 102, the insulation film is respectively formed by the oxide film such as $SiO_2$ to be electrically insulated each other.

In such a honeycomb CCD, the production process can be simplified because all pixel reading can be operable even when the charge transfer electrode is structured by double-layered polysilicon structure. Further, four electrodes can be arranged in each pixel. In this case, driving by the four-phase transfer pulse enables the electric charge amount to be operated to increase about 1.5 times of the case of the three-phase driving. In the honeycomb structure, as compared to the conventional IT-CCD, the area of the light receiving portion can be relatively increased, and the high sensitivity is also obtained because the resolution in the horizontal line and vertical row directions is high, even in the case of the high integration going on (e.g. increase of the density, increase of the number of pixels).

However, accompanied by the increase of the number of pixels of the IT-CCD, and the increase of the chip size, which makes the charge transfer electrode length to be relatively longer than the electrode width and electrode thickness, the electrical resistance becomes something that can not be disregarded. In the conventional IT-CCD, when the transfer pulse is supplied from the outside, a midway portion to feed the power is not provided due to the structure of the power being fed only from the end portion to the charge transfer electrode extending in the horizontal line direction in the image pick-up area. Therefore, specifically, in the CCD whose image pick-up area (image size) is large, or in the high-integrated pixel CCD whose unit pixel is highly integrated, the waveform of the transfer pulse in a position separated from the initial power feed portion is distorted by the resistance component or capacitance component of the electrode which is long in the lateral direction, and further, the drive voltage is lowered, both which causes a the problems of the charge transfer efficiency being lowered.

Accordingly, in the present embodiment, in order to reduce the electrical resistance of the charge transfer electrode, the electrical resistance shall be reduced, which avoids increasing thickness of the polysilicon layer of the charge transfer electrode. This is realized by laminating the electrode material, whose resistivity is smaller than that of the charge transfer electrode formed of polysilicon, in the longitudinal direction which intersects the charge transfer electrode through the insulation film and crosses it. Further, because the film thickness of the polysilicon electrode itself can be reduced, the thickness of the gate film oxide, film oxide between polysilicon layers, can be reduced more than the conventional case, and as the result, the drive voltage of the CCD image pick-up device can be lowered.

Figure 2:
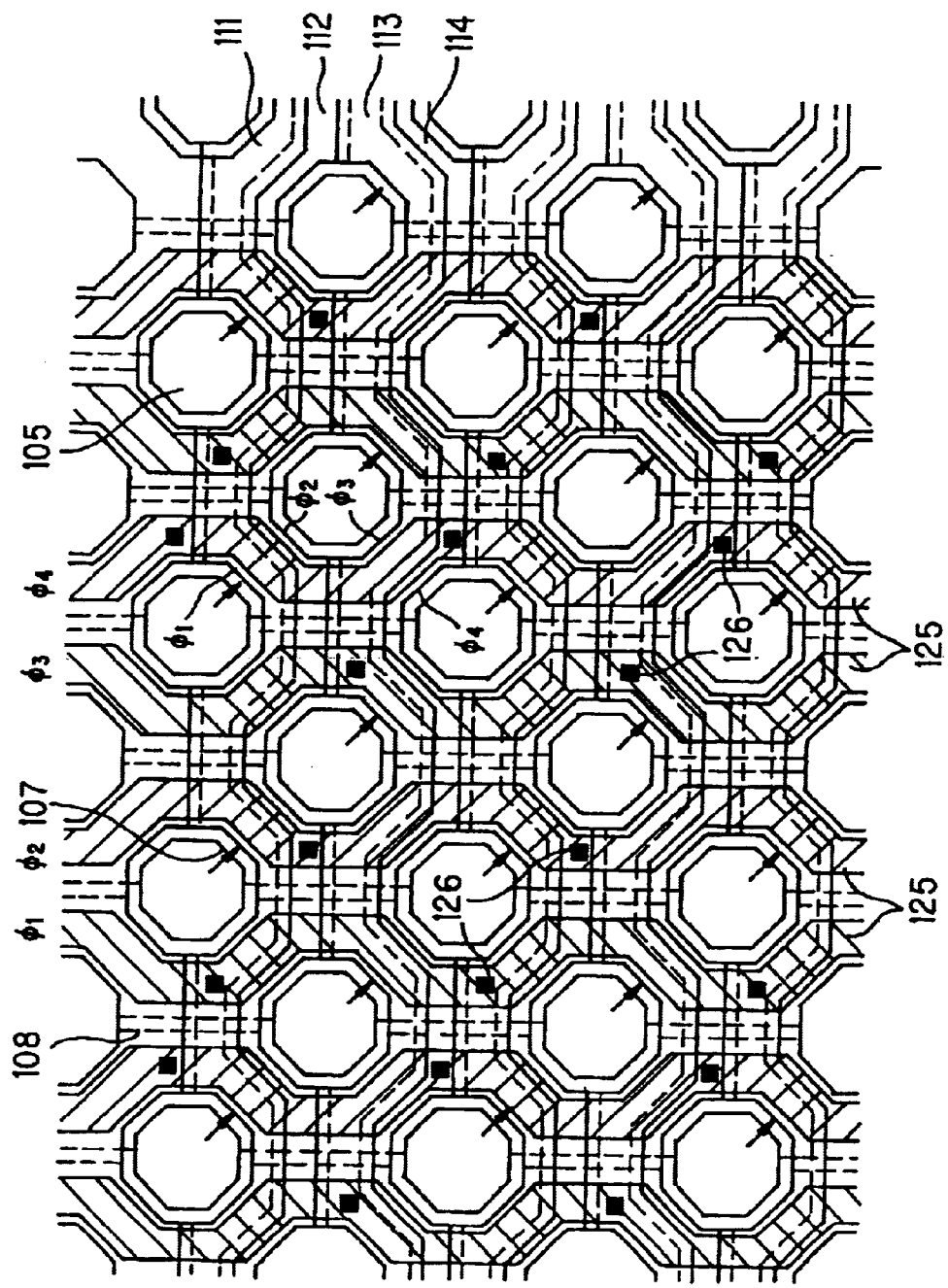
FIG. 2 is a plan view in which the structure of an image pick-up portion of a solid-state image pick-up apparatus according to the first embodiment of the present invention is enlarged and shown.
Figure 3:
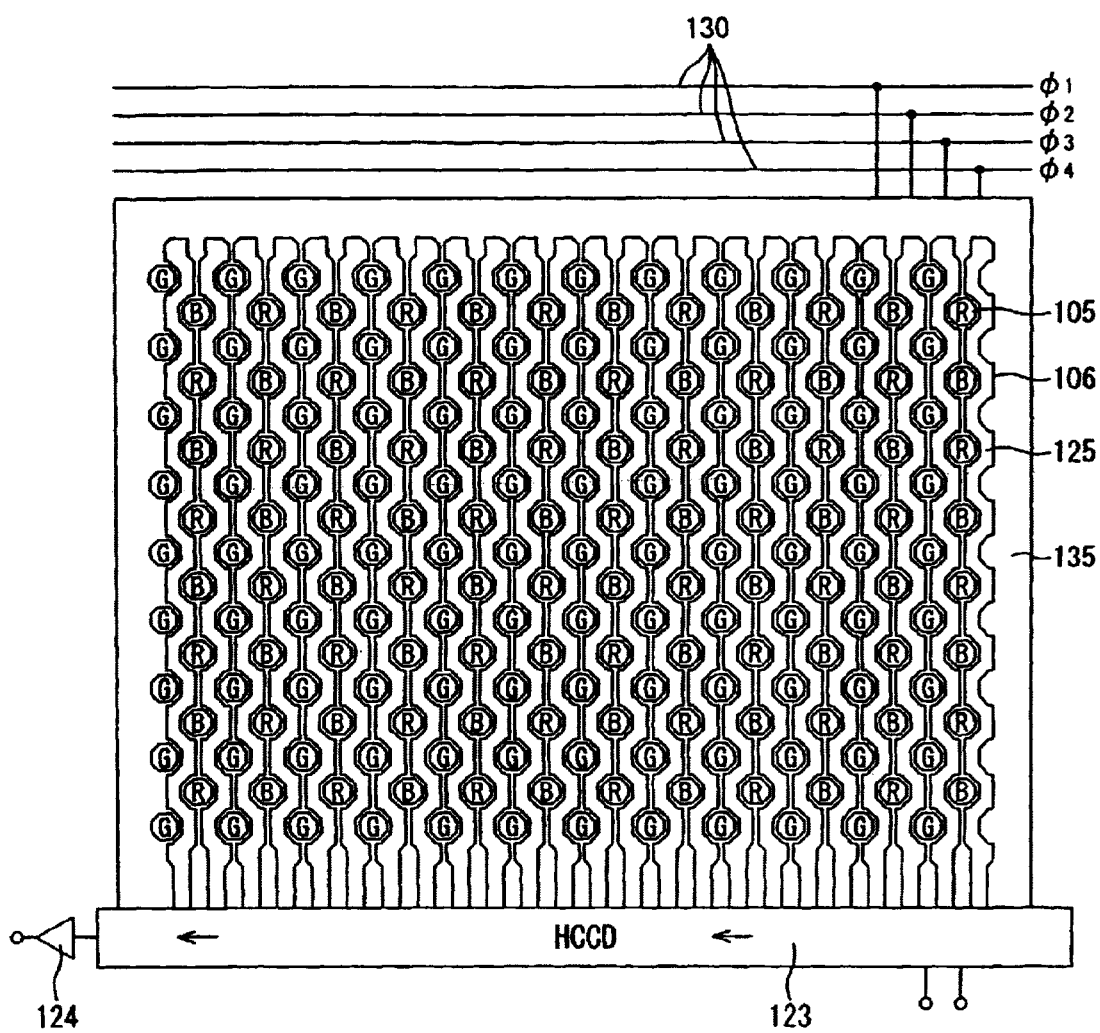
FIG. 3 is a structural illustration showing the overall structure of the solid-state image pick-up apparatus according to the first embodiment.
Figure 4:
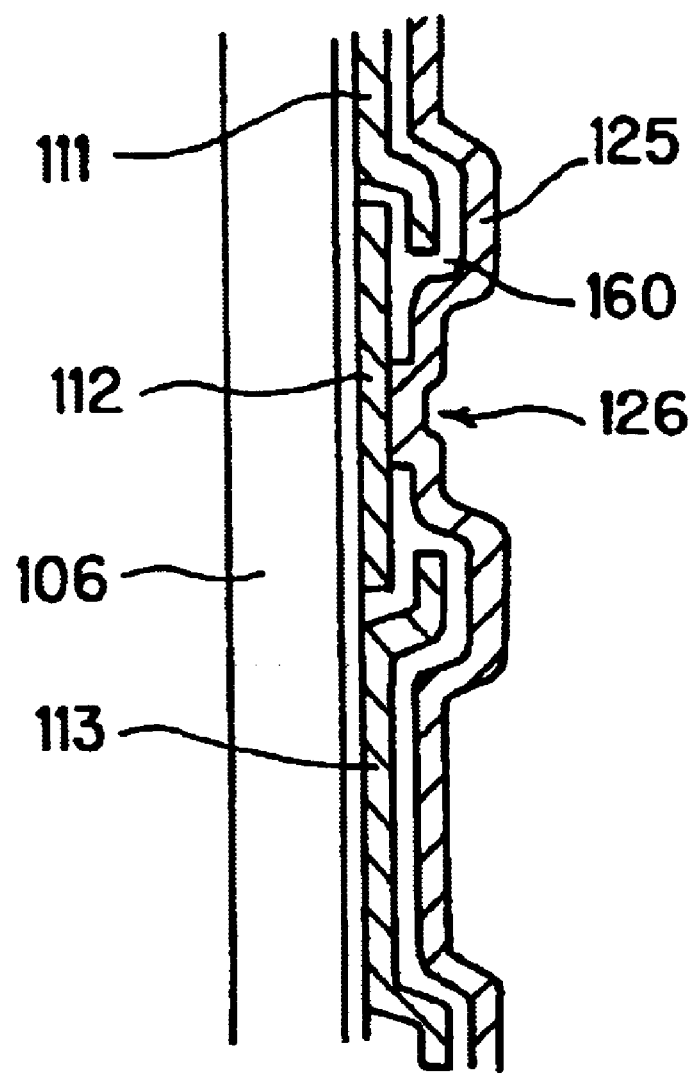
FIG. 4 is a sectional view showing the structure of a contact portion by which a polysilicon electrode and a metallic wiring are electrically connected.

FIG. 2 is a plan view showing by enlarging the structure of the image pick-up portion of the solid-state image pick-up device according to the first embodiment of the present invention, and FIG. 3 the structural illustration showing the overall structure of the solid-state image pick-up device according to the first embodiment, and FIG. 4 is a sectional view showing the structure of a contact portion by which the polysilicon electrode and the metallic wiring are electrically connected.

In the honeycomb CCD in the present embodiment, as described above, the light receiving portion 105. and the charge transfer path 106 adjoining it, and the vertical charge coupled device (VCCD) composed of the charge transfer electrodes 111–114 are arranged two dimensional plane-likely. So called the honeycomb arrangement is structured in such a manner that one horizontal pixel line in the light receiving portion 105 is respectively shifted by ½ horizontal pixel pitch in the horizontal line direction to the adjoining pixel line, and further, the one vertical pixel row is arranged being shifted by ½ vertical pixel pitch in the vertical row direction (longitudinal direction) to the adjoining pixel row. In the VCCD, the charge transfer electrodes 111–114 to supply 4-phase transfer pulses φ1–φ4 to one pixel are provided. Each of charge transfer electrodes 111–114 is extended in the line direction (lateral direction) while being windingly formed so as to avoid the light receiving portion 105.

A signal charge generated in the light receiving portion 105 by light receiving the incident light is read from the reading gate 107 provided in the right lower portion in drawing, onto the a charge transfer path 106. The charge transfer path 106, adjoining the light receiving portion 105 of each pixel, is formed in the longitudinal direction extending from the upper portion toward the lower portion in the row direction (longitudinal direction) in the drawing in winding way between the light receiving portions 105 which are arranged honeycomb-likely, and it forms the VCCD together with the charge transfer electrodes 111–114.

As shown in FIG. 3, in the lower portion of the image pick-up area 135 in which the light receiving portion 105 and the charge transfer path 106 of the VCCD are provided, a light shielded horizontal charge transfer portion (HCCD) 123 of 2-phase drive is provided, and the end portion of each VCCD is connected to HCCD 123. Furthermore, to the end of HCCD 123, a signal reading circuit 124 having a Floating Diffusion Amplifier (FDA) is connected, and from the signal reading circuit 124, the signal charge is read outside the CCD device.

In the present embodiment, in order to reduce the electrical resistance of the polysilicon electrode used as the charge transfer electrodes 111–114 of VCCD, so called metal backing structure in which the electrode material whose resistivity is smaller than polysilicon, for example, Al(aluminum) or W (tungsten) is used for a metallic wiring 125 and layered on the polysilicon electrode through the insulation film, is formed. This metallic wiring 125 is electrically connected to respective charge transfer electrodes 111–114 through the contact hole. The metallic wiring 125 is provided for each transfer path so as to intersect the double-layered structure polysilicon electrode and crosses it in the longitudinal direction in the drawing in winding way along the charge transfer path 106. In this manner, total four metallic wirings 125, corresponding to the charge transfer electrodes 111–114 for each phase, are respectively connected to polysilicon electrode.

As shown in FIG. 4, the insulation film 160 formed by SiO$_2$ is provided among those charge transfer electrodes 111–114 and on the upper portion of the charge transfer electrodes 111–114, the metallic wiring 125 is further provided on the upper portion thereof. The contact hole 126 is formed at a predetermined position of the insulation film 160, and by the contact hole 126, the charge transfer electrodes 111–114 and the metallic wiring 125 are respectively conducted, and electrically connected. There provided at least one contact hole 126 so as to position on the corresponding polysilicon electrode. This metallic wiring 125 is extended in the longitudinal direction in the drawing, and in the upper portion of the image pick-up area, its end is electrically connected to the wiring pattern 130 for transferring the transfer pulses φ1–φ4 for the drive supplied from the outside of the device.

In this connection, although not shown in the drawing, a protective film (flattening film) is provided on the surface of the IT-CCD of the present embodiment. On this surface protective film, a light shielding film having small optical windows, color filter and micro lens are formed in the same as the normal CCD image pick-up device, and the high sensitivity color IT-CCD is structured at the end.

Figure 20:
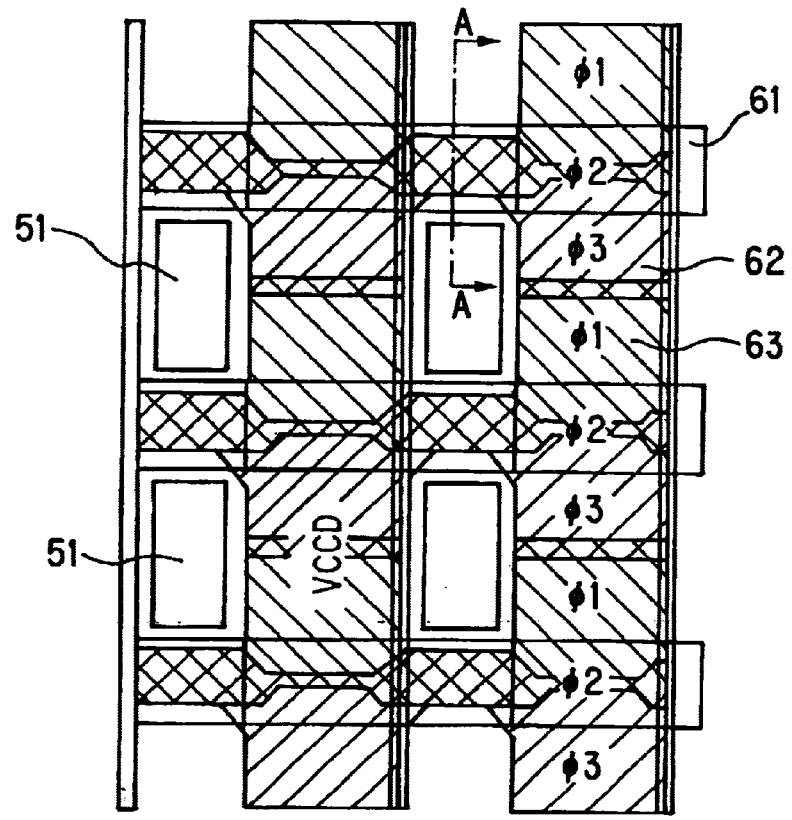
FIGS. 20(A) and 20(B) show the views showing the main portion of the conventional IT-CCD, where (A) is a plan view, and (B) is an A—A sectional view.
Figure 20:
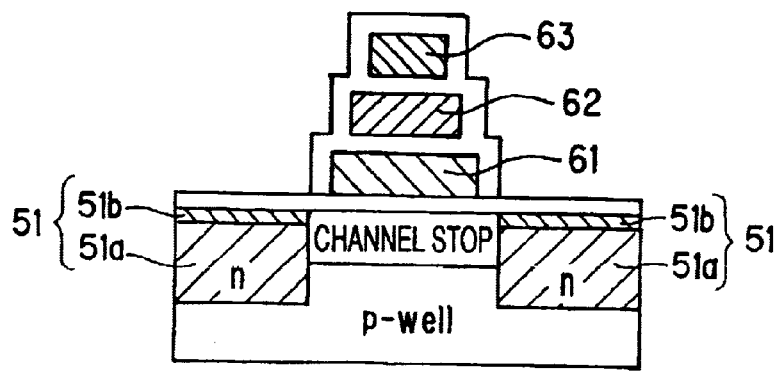
Figure 21:
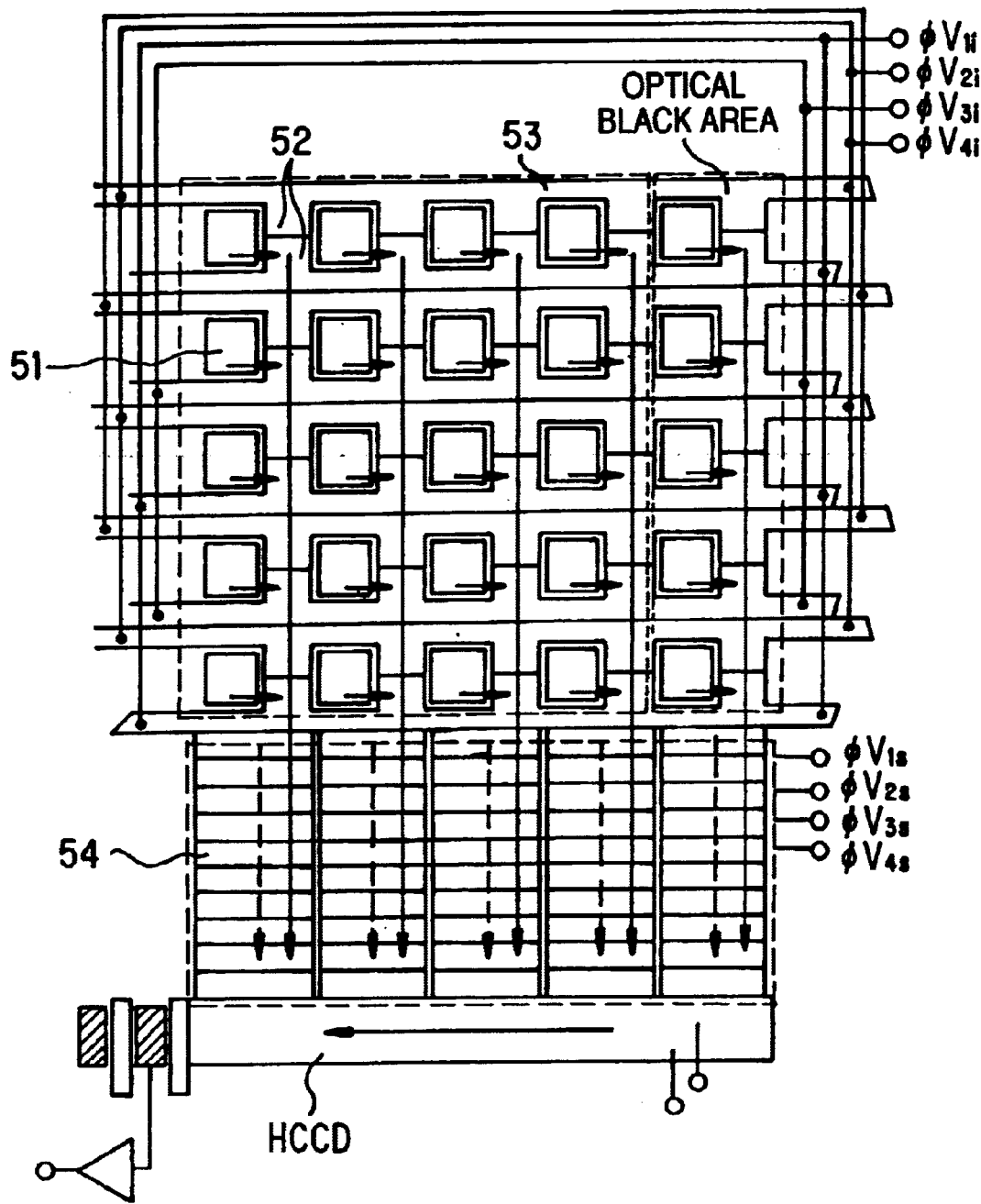
FIG. 21 is a plan view showing the structure of the conventional frame interline transfer type CCD.
Figure 22:
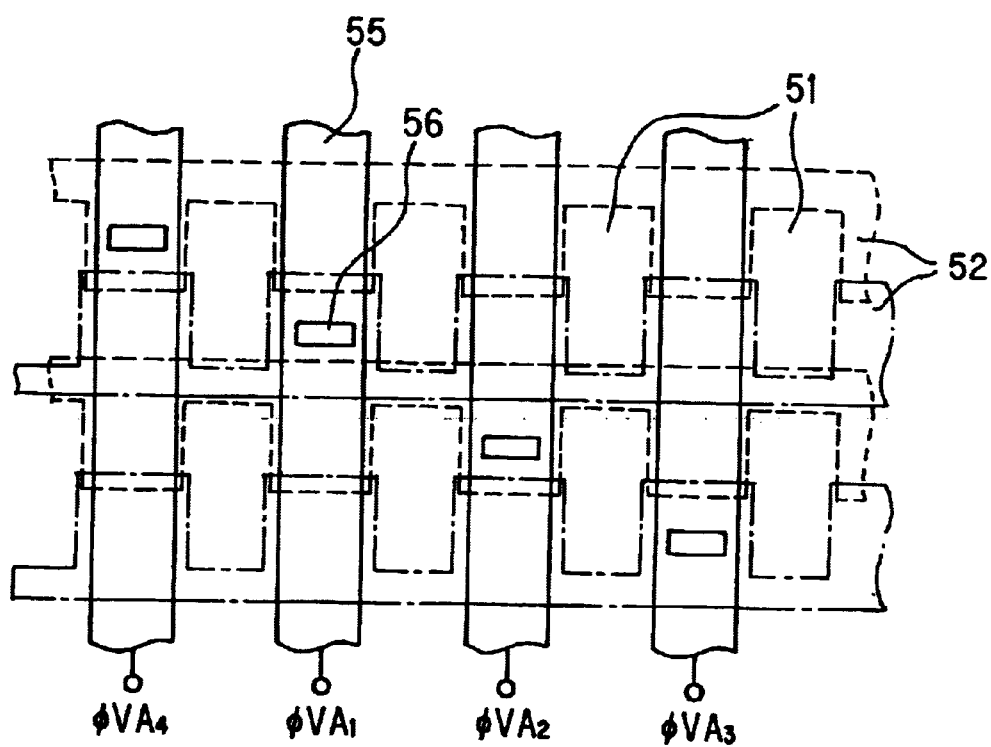
FIG. 22 is a plan view showing a metal backing structure provided in the conventional IT-CCD.

Also in the conventional IT-CCD, there is an example such that the metallic wiring is layered as the metal backing structure, however, because, in the case of the IT-CCD, the available area for the metal wiring is on the upper portion of the VCCD of the side of the light receiving portion, as shown in FIG. 22, by which the design restriction is placed on the layout of the metallic wiring. Further, in the IT-CCD which is all pixel reading type, its polysilicon electrode with triple-layered structure makes it difficult for the charge transfer electrodes for all the phases to provide the metallic wiring thereon for contacting and connecting to them as shown in FIG. 20(A). Therefore the metallic backing structure is applied only to the FIT-CCD having double-layered polysilicon electrode which is the interlace reading type. On the contrary, however, in the honeycomb CCD in the present embodiment, although all pixel reading type is adopted, the charge transfer electrode can be formed by double-layered polysilicon structure so that the metallic wiring can be easily extended in the longitudinal direction and provided to the charge transfer electrodes of all phases or layers. Further, the position of the contact hole for conducting the polysilicon electrode and the metallic wiring to be electrically connected can be also set without any layout restrictions.

As for the electrode material, Al, W, Cu(copper), Ti (titan), Co (cobalt), Ni (nickel), Pd (palladium), Pt (platinum), or these nitride (WSi (tungsten silicon)), silicide (TiSi (titan silicon), alloy, compound, or complex might be suitable. Al is easily processed and easily operated, and due to its small electrical resistance, it is often used for the backing metallic wiring. By using the layered film of W (tungsten), W and WN (tungsten nitride) or W and TiN (titan nitride) where the alloy is not formed between the layered film and polysilicon, the potential shift (a partial change of the potential) hardly occurs, and the efficient charge transfer can be conducted at VCCD. Further, from the fact that W is also used for the light shielding film of the IT-CCD, it may be commonly used with together.

Having this metal backing structure, the resistance factor of the charge transfer electrode can be lowered without increasing the film thickness of the polysilicon electrode itself. In the conventional CCD, the thickness of the polysilicon electrode is about 0.4 μm–0.7 μm, however, according to the structure of the present embodiment, also when the film thickness of the polysilicon electrode is not larger than 0.3 μm, the normal high speed charge transfer can be conducted. In this way, thickness of the polysilicon electrode is reduced, and the etching precision for the electrode formation process can be improved so that its integration can be easily done.

In the multi-layered polysilicon CCD whose charge transfer electrode might be double layered or triple layered polysilicon electrodes, it is necessary that the wafer processing such as deposition, photo-lithography, etching of the polysilicon film for each polysilicon electrode formation might be repeated for at least the number of layers to be layered. In this case, in order to insulate a polysilicon electrode from each other, the polysilicon surface is thermally oxidized to form the silicon oxide film. Therefore, in the case of CCD, its gate oxide film formed on the silicon substrate surface is formed to be thicker than that of CMOS logical IC. This is because through the polysilicon etching process, thickness of the gate oxide film to protect the silicon surface should be reduced so that the gate oxide film is required to be formed fairly thicker beforehand. However, in case of thickness of the gate oxide film being increased, the transfer pulse voltage to be impressed on the charge transfer electrode must be set high enough. Accordingly, if the thickness of the polysilicon electrode can be reduced, thickness of the gate oxide film can be relatively reduced, so that the drive voltage of CCD can be lowered.

As described above, in the present embodiment, the electrical resistance of the charge transfer electrode can be easily reduced even by using the IT-CCD, which is all pixels read out type, without increasing the thickness of the charge transfer electrode formed of double-layered polysilicon electrode to supply the transfer pulse to the VCCD. Accordingly, even in case of the size of CCD or its density being increased, changing the potential voltage of the drive pulse can be performed in almost the same level over all the image pick-up area in which the light receiving portion of each pixel is arranged so as to perform the high speed drive. Further, as the effect of this invention, the step difference shape on each light receiving portion is alleviated, and the processing time of the thermal oxidation and diffusion process is also shortened, thus integration of the device becomes easy one.

Figure 5:
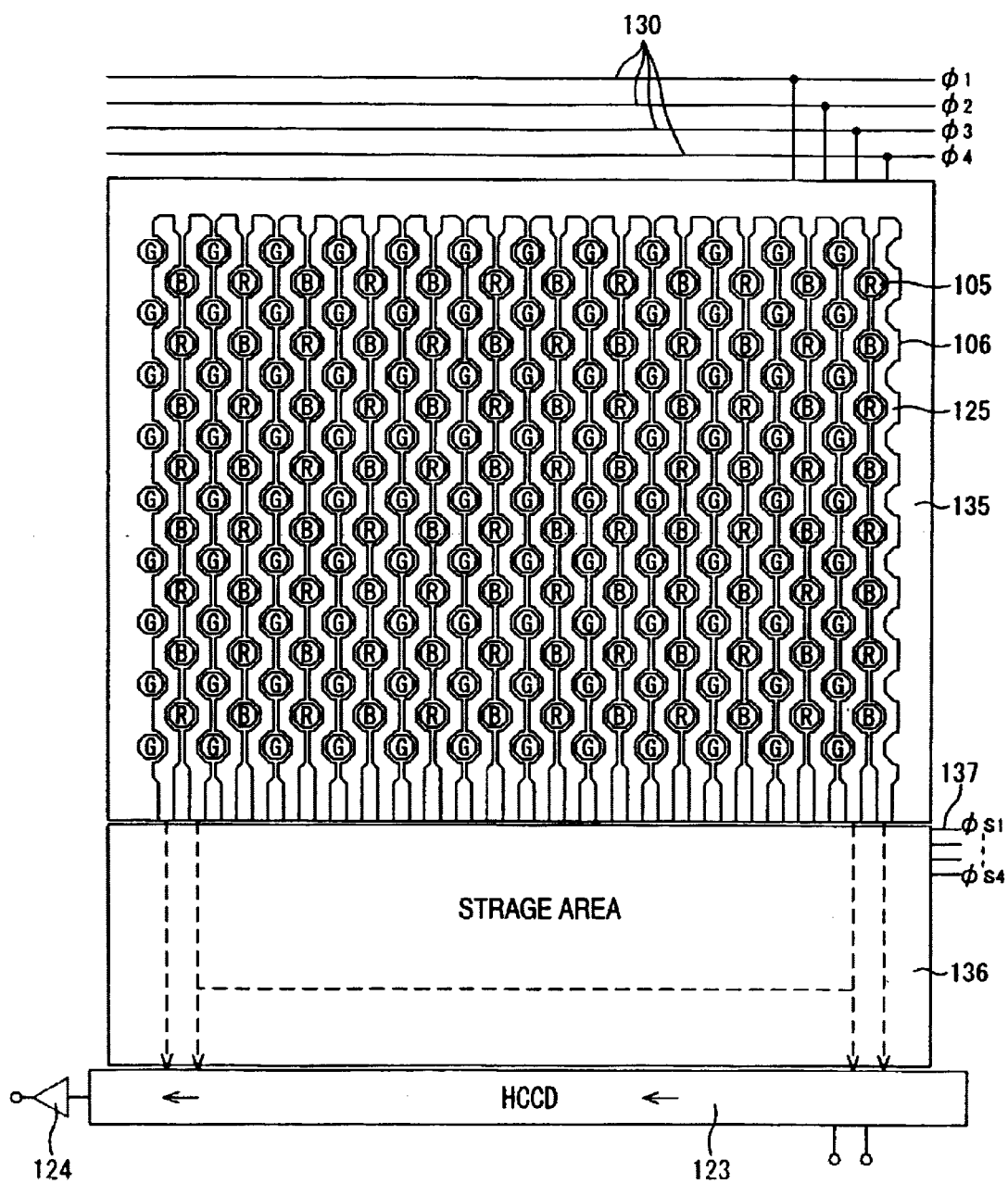
FIG. 5 is a structural illustration showing the overall structure of the solid-state image pick-up apparatus according to the second embodiment of the present invention.

FIG. 5 is a structural illustration showing the overall structure of the solid-state image pick-up device according to the second embodiment of the present invention. The second embodiment shows an example in which the storage area is provided in addition to the structure of the first embodiment.

In the lower portion of the image pick-up area 135 in which the light receiving portion 105 and the charge transfer path 106 of VCCD are provided, the storage area 136 having the light shielded storage portion is provided, and all pixel reading type FIT-CCD of the honeycomb structure is structured. The storage area 136 has, for example, the charge storage capacity corresponding to the number of all pixels, and the light shielded 2-phase drive HCCD 123 is connected to the end portion of this storage are 136, and further, the signal reading circuit 124 having the FDA is connected to the end of the HCCD 123. Since this storage area 136 is the structure without the photodiode, VCCD is not formed windingly but formed linearly in the same manner as the conventional square FIT-CCD.

Further, although the detail is not shown, in the polysilicon electrode which supplies the transfer pulse to the VCCD in the storage area, the metallic wiring whose electrical resistance is small is layered in the same manner as that of the image pick-up area. This metallic wiring is arranged extending in the longitudinal direction or the lateral direction, and in the same manner as the VCCD in the image pick-up area, the end is connected to the wiring pattern 137 to transfer the transfer pulse from the outside, and for example, it is driven by four-phase transfer pulses $\phi s1$-$\phi s4$. In this connection, it is also possible that the VCCD in the image pick-up area and the VCCD in the storage area are driven by the same drive pulse, and in this case, the metallic wiring can be commonly used for both the areas.

As described above, the honeycomb CCD in the present embodiment has its polysilicon electrode that can lower the electrical resistance of the charge transfer electrode so that even using IT-CCD, reading all pixels, it makes it possible to provide the metallic wiring easily to the charge transfer electrode of all layers (phases), and perform high speed charge transfer. Therefore, even all pixel read out type FIT-CCD is structured, the charge is transferred at the high speed from the image pick-up area, and due to the signal charge being temporarily accommodated in the light shielded storage area, the smear can be significantly reduced.

Figure 6:
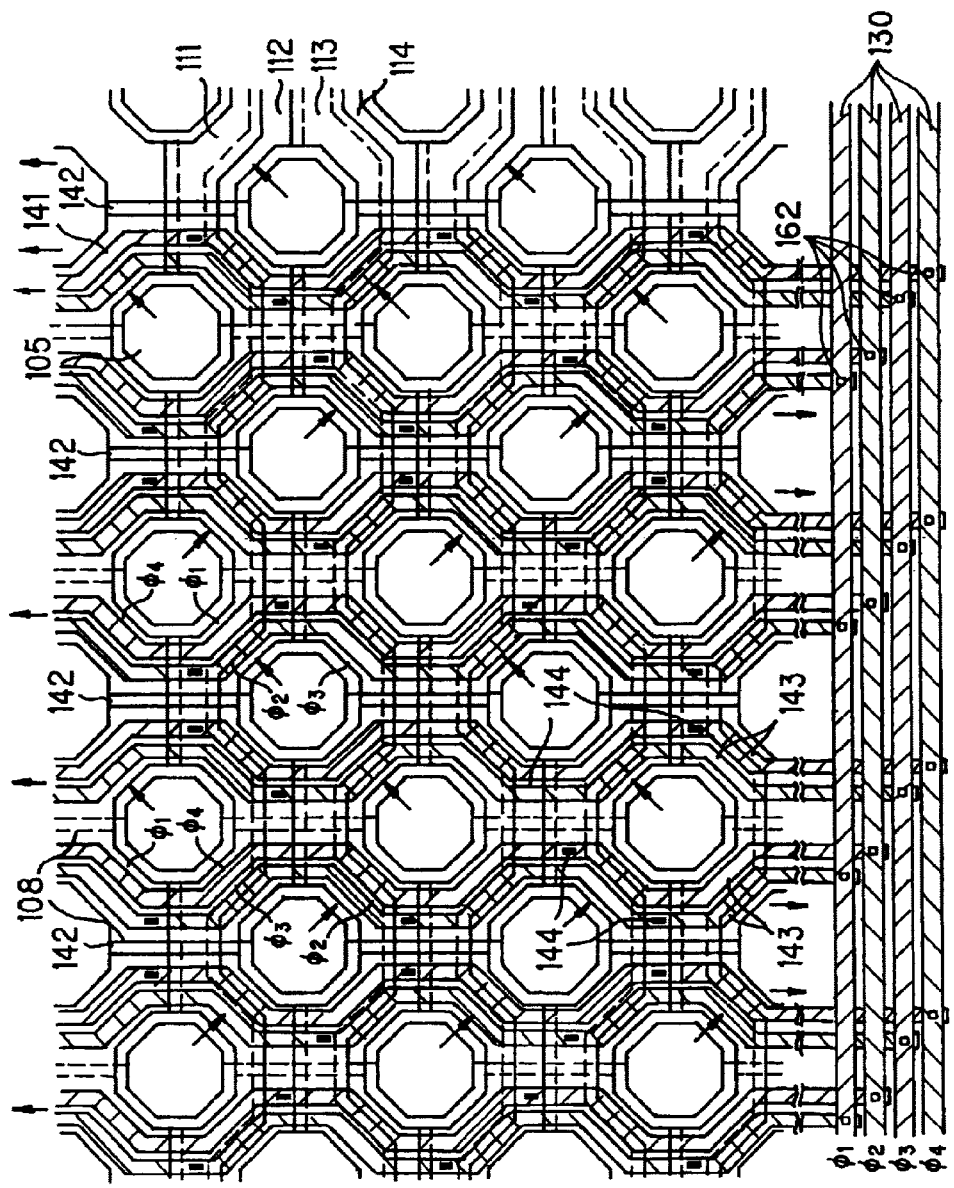
FIG. 6 is a plan view in which the structure of the image pick-up portion of the solid-state image pick-up apparatus according to the third embodiment of the present invention is enlarged and shown.
Figure 7:
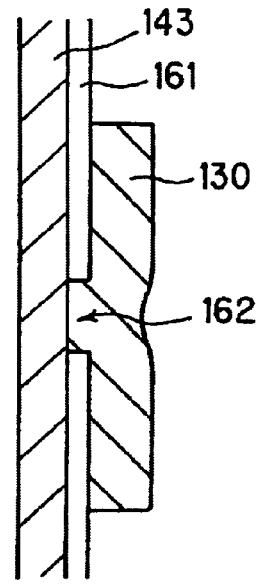
FIG. 7 is a sectional view showing the structure of a contact portion by which a wiring pattern connected to the transfer pulse supply source and a metallic wiring are electrically connected.
Figure 8:
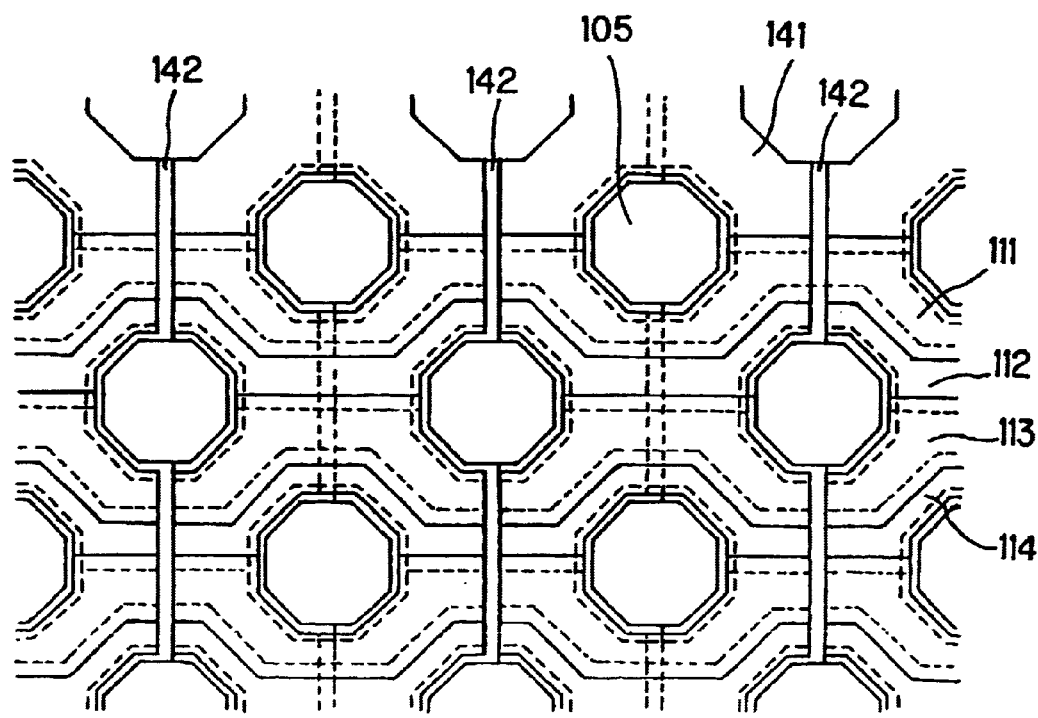
FIG. 8 is a plan view in which the plane structure of the polysilicon electrode according to the third embodiment is enlarged and shown.
Figure 9:
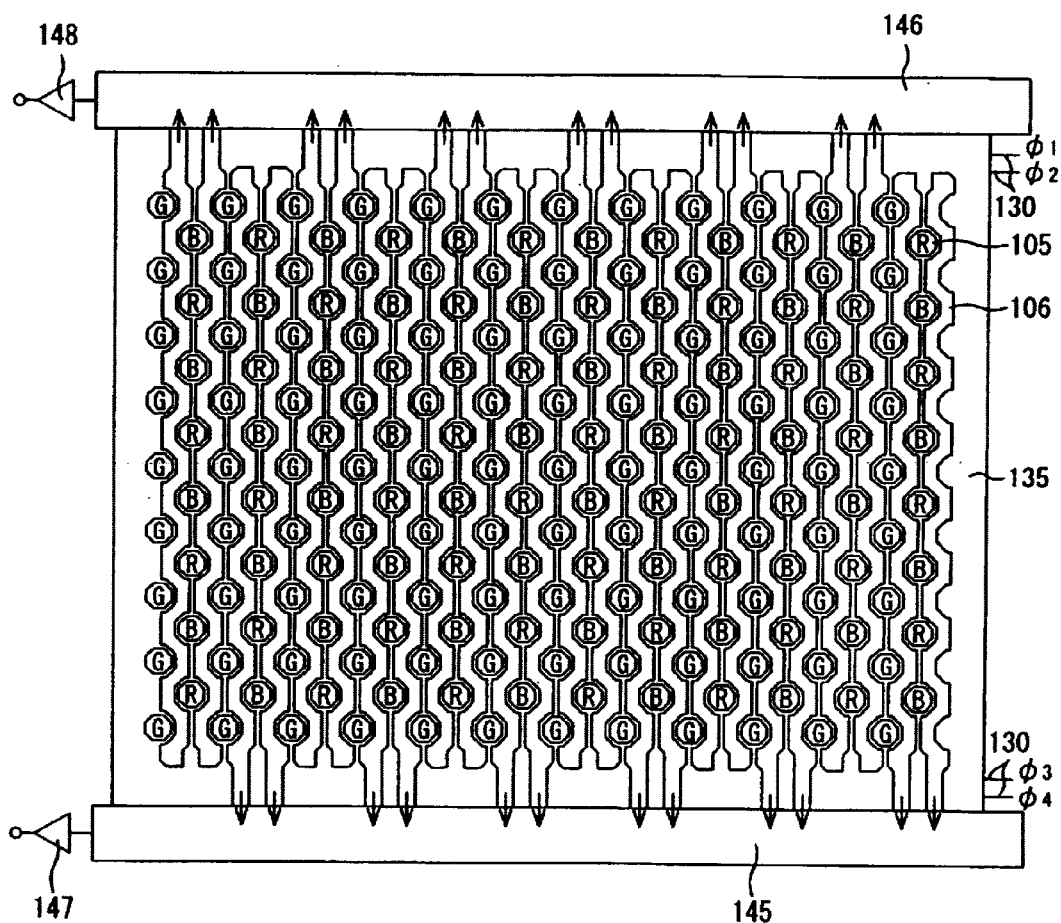
FIG. 9 is a structural illustration showing the overall structure of the solid-state image pick-up apparatus according to the third embodiment.

FIG. 6 is a plan view showing the enlarged structure of the image pick-up portion of the solid-state image pick-up device according to the third embodiment of the present invention, and FIG. 7 is a sectional view showing the structure of the contact portion by which the wiring pattern connected to the transfer pulse supply source and the metallic wiring are electrically connected. Further, FIG. 8 is a plan view showing the enlarged plane structure of the polysilicon electrode according to the third embodiment, and FIG. 9 is a structural illustration showing the overall structure of the solid-state image pick-up device according to the third embodiment. The third embodiment shows the first example in which the charge transfer electrode is separated for each predetermined unit of VCCD in the image pick-up area and the charge is alternately transferred to up and down directions.

The charge transfer path 106 adjoins the light receiving portion 105 and in the view, is extended in the longitudinal direction and structures the VCCD together with the charge transfer electrodes 111–114. In the polysilicon electrode 141 structuring the charge transfer electrodes 111–114, the separation portion 142 is formed above the channel isolation or channel stopper 108 at every 2 VCCDs, that is, in the vertical pixel row of the light receiving portion 105, it is electrically separated for each pixel. Thereby, the polysilicon electrode 141 on the charge transfer path 106 surrounding the light receiving portion of each pixel can be independently driven.

On the polysilicon electrode 141 of VCCD, there two metallic wirings 143 are respectively provided for one VCCD in the direction of crossing over the polysilicon electrodes 141 with the insulation film in-between. That is, every two metallic wirings 143 are arranged for each transfer path to be patterned windingly along the VCCD in the longitudinal direction in the view such as to intersect and cross over the polysilicon electrode 141 of double-layered structure, and each of the four metallic wirings 143 is respectively connected the polysilicon electrode 141 that is corresponding to each of charge transfer electrodes 111–114. Further, these metallic wirings 143 are extended in the longitudinal direction in the view so that their distal end portions are electrically connected to the metallic wiring pattern 130 from which transmitted are the transfer drive pulses φ1–φ4 supplied from the outside of the device.

In this regards, the wiring pattern can be appropriately structured such that the wiring pattern 130 may also be arranged in the lower portion of the image pick-up area as shown in FIG. 6, or as shown in FIG. 3, it may be arranged in the upper portion of the image pick-up area, or as shown in FIG. 9, it may be arranged to be split into two portions such as up and down ends of the image pick-up area. In the example of FIG. 6, the metallic wiring 143 is formed by W, and the wiring pattern is formed by Al. In this case, as shown in FIG. 7, after the metallic wiring 143 is formed, the insulation film 161 such as the plasma CVD film (for example, SiO2) is layered. Then, the contact hole 162 is formed in order to electrically contact with the wiring pattern 130. Furthermore, by forming the wiring pattern 130 on the insulation film 161, the metallic wiring 143 and the wiring pattern 130 are conducted so that necessary drive pulse can be supplied to the charge transfer electrodes 111–114 of the VCCD from the wiring pattern 130.

A set of four polysilicon electrodes, which is allocated to a pair of the VCCD rows, is arranged to be isolated from the adjacent sets of electrodes and connected to the metal wirings 143 as shown in FIG. 6. Concerning the adjacent sets of the electrodes in the lateral direction, one set of the phases φ1–φ4 of the transfer pulse are reversed or differed from another sets of the phases φ1–φ4. In other words, each of adjoining sets' pulse is alternately driven by the different phase from one another by changing the positions to form the contact portions 144 for connecting the metallic wirings and its respective polysilicon electrodes together. Accordingly, in this arrangement, the charge transfer direction of a pair of the VCCD rows becomes opposite from that of another pair of the VCCD rows. In order to easily understand the unit of each set of the separated polysilicon electrode 141, FIG. 8 shows only the polysilicon electrode 141 (charge transfer electrodes 111–114) except for the metallic wiring.

As shown in FIG. 9, on both up and down end portions of the image pick-up area 135 in which the light receiving portion 105 and the charge transfer path 106 of VCCD are provided, respective light shielded two-phase drive HCCDs 145 and 146 are provided, and the end portion in the transfer direction of each VCCD is connected to respective HCCDs 145 and 146. Then, to the end of each of HCCDs 145 and 146, the signal reading circuits 147 and 148 having FDA (Floating Diffusion Amplifier) are connected. That is, it is structured such that every two VCCDs are connected to the upper side or lower side HCCD, and the transfer charge is alternately read out to the up and down directions. The structure of the other portion is the same as in the first embodiment.

As described above, in the present embodiment, by the metal backing structure in which the metallic wiring is arranged in the longitudinal direction in the honeycomb CCD where VCCDs are electrically separated by every sets of two VCCDs, which is driven by the different phase so that the signal charge can be transferred alternately in the opposite up and down direction. Concerning the distal ends of HCCDs located at up and down end portions, their transfer frequency becomes about half of the case where the HCCD is provided at only one end, and the requirement of the high speed drive of the HCCD accompanied by the high speed transfer of the VCCD is alleviated so that the low consumption power and the high transfer efficiency can be obtained. Further, it is also appropriate for reading out the interlaced image of the moving image mode, and in this case, the output from the one side HCCD is read out, and the other HCCD can be out of operation.

Further, according to the structure of the present embodiment, in case of the number of pixels or density of the IT-CCD being increased, the integration density in the line direction of the HCCD can be relatively low, and further, it brings about the advantages in power consumption reduction of the HCCD which dominates large part of whole power consumption.

Figure 10:
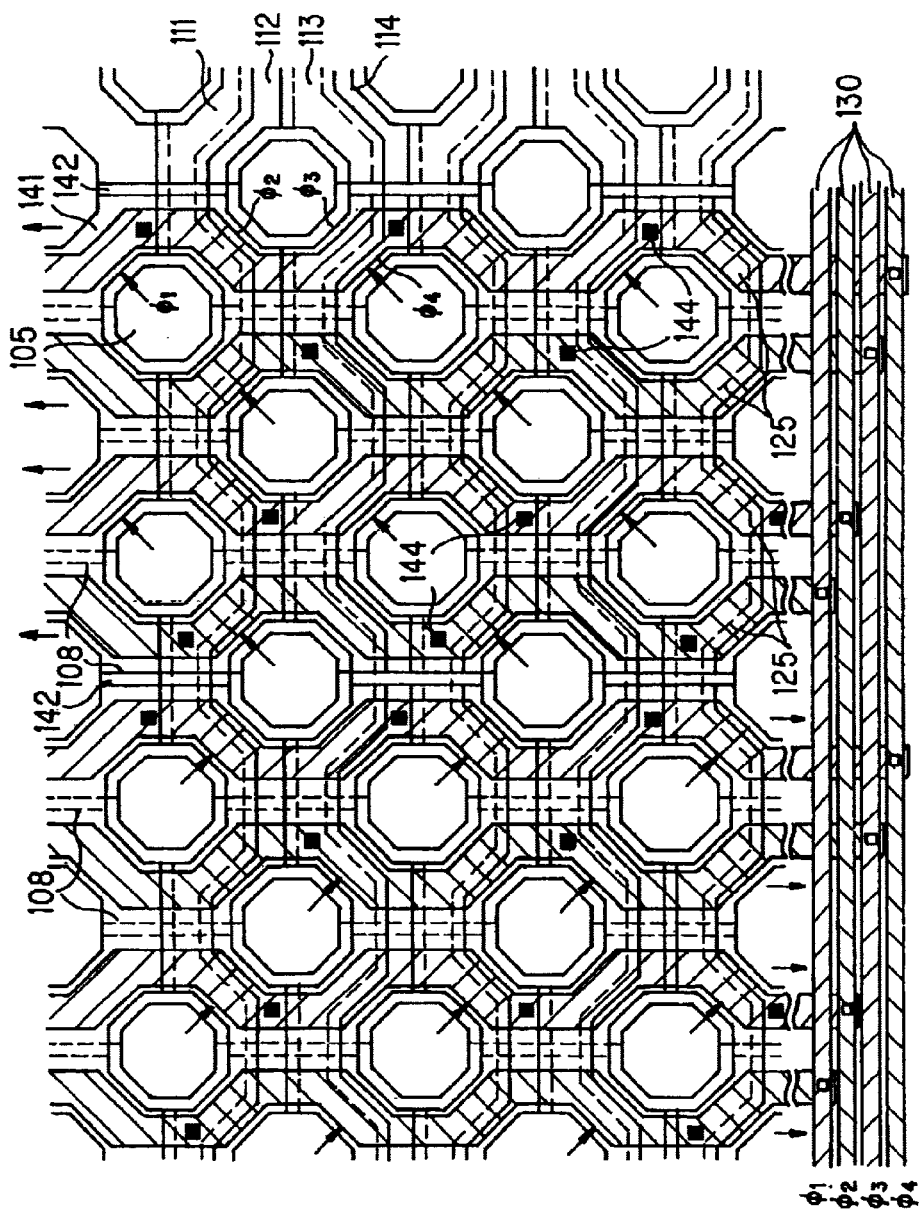
FIG. 10 is a plan view in which the structure of the image pick-up portion of the solid-state image pick-up apparatus according to the fourth embodiment of the present invention is enlarged and shown.
Figure 11:
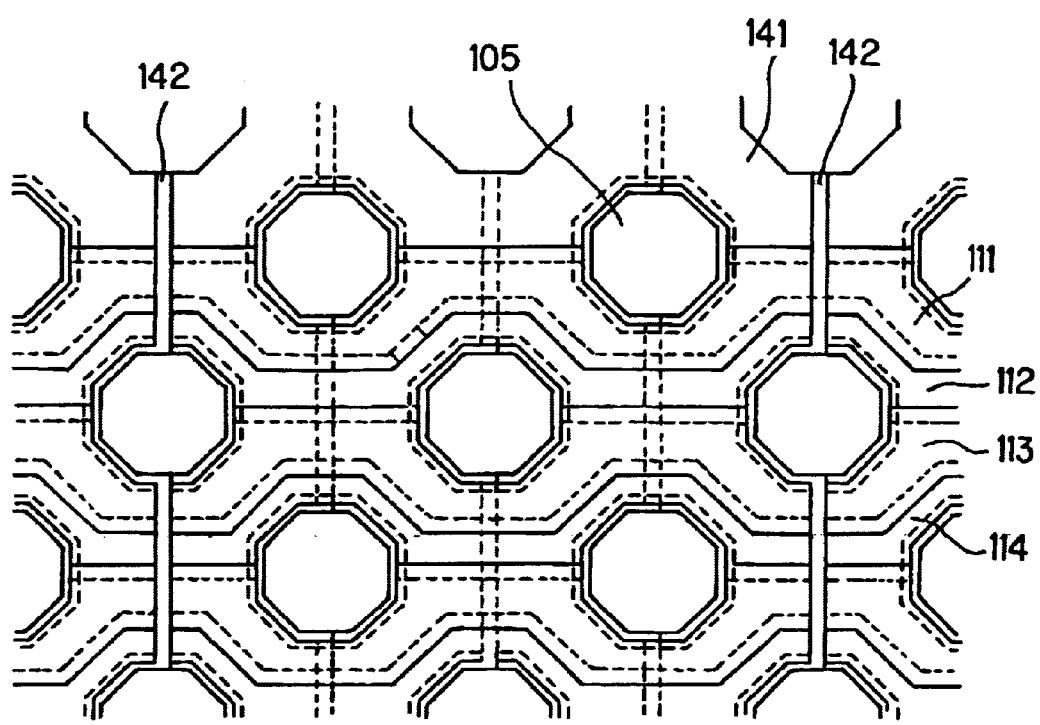
FIG. 11 is a plan view in which the plane structure of the polysilicon electrode according to the fourth embodiment is enlarged and shown.
Figure 12:
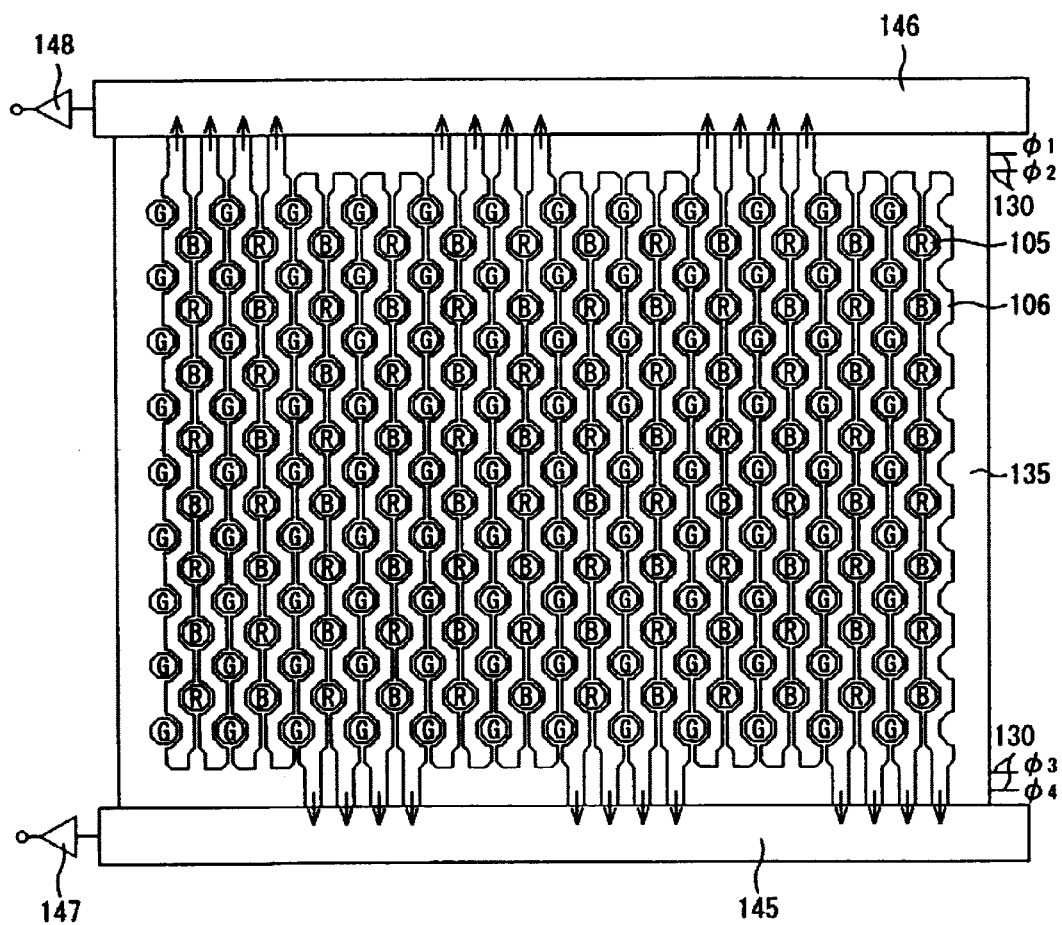
FIG. 12 is a structural illustration showing the overall structure of the solid-state image pick-up apparatus according to the fourth embodiment.

FIG. 10 is a plan view showing the enlarged structure of the image pick-up portion of the solid-state image pick-up device according to the forth embodiment of the preset invention, and FIG. 11 shows an enlarged plan view of the plane structure of the polysilicon electrode according to the fourth embodiment. Further, FIG. 12 is a structural illustration showing the overall structure of the solid-state image pick-up device according to the fourth embodiment. The fourth embodiment shows the second example in which the charge transfer electrode is separated for each predetermined unit of the VCCD in the image pick-up area and the charge is made to be transferred alternately in the up and down direction.

The fourth embodiment is a modified example of the third embodiment, and is the structure in which the charge transfer electrode is separated by every set of four VCCDs. In double-layered polysilicon electrodes 141, the separation portion 142 is formed above the channel stop 108 for every set of four VCCDs. In other words, said every set of four VCCDs are corresponding to every set of two pixels that is electrically separated at the vertical pixel row of the light receiving portion 105. Therefore, in the fourth embodiment, the length of the lateral direction of the polysilicon electrode is almost twice as compared to that of the third embodiment.

On the polysilicon electrode 141 of the VCCD, in the same as the first embodiment, one metallic wiring 125 is respectively provided to one VCCD in direction of crossing over the polysilicon electrode 141 with the insulation film being formed in-between. In other words, the metallic wirings 125 are arranged in the longitudinal direction such as to intersect and cross over the double-layered structure polysilicon electrode 141, which is running in lateral direction, with winding along the VCCD in a manner such that each one metallic wiring is arranged for each transfer path, and the four metallic wirings 125 are respectively connected to the corresponding charge transfer electrodes 111–114.

A set of four polysilicon electrodes is arranged in the relation of a set of four VCCDs which are separated from each adjacent sets of the electrodes, as shown in FIG. 10, where a set of the four phases of transfer pulses φ1–φ4 are driven in the same manner as that of the first embodiment. Accordingly, in this case, the contact portion 144 by which the metallic wiring and polysilicon electrode are connected is formed so that the charge transfer direction of each set of the four VCCD rows becomes opposite from that of adjacent set of the VCCD rows. FIG. 11 shows only the polysilicon electrode 141 (charge transfer electrodes 111–114) except for the metallic wiring so that the unit of each set of the separated polysilicon electrodes 141 may be easily understood.

As shown in FIG. 12, at up an down end portions of the image pick-up area 135 in which the light receiving portion 105 and the charge transfer path 106 of the VCCD are provided, in the same manner as the third embodiment, respectively provided are the light shielded double-phase drive HCCDs 145 and 146 to which the respective end portion of the transfer direction of each VCCD is connected. In the fourth embodiment, it is structured such that every set of four VCCDs are connected to upper side or lower side of HCCDs so that transfer charge is alternately read out in the up and down direction respectivley. The structure of the other portion is the same as that of the third embodiment.

As described above, in the present embodiment, the charge transfer electrodes are electrically separated by every set of four VCCDs so that the signal charge can be alternately transferred in the opposite up and down direction. In the same manner as the third embodiment, the requirement of the high speed drive of the HCCD accompanied by the high speed transfer of the VCCD is alleviated, and the low power consumption and the high transfer efficiency can be also obtained. Further, it is appropriate for reading out of the interlaced image such as the moving image mode, and in such a case, while reading the output from only one side of HCCD, the other HCCD can be out of operation. In addition to that, since the numbers of the metallic wirings arranged on each VCCD is reduced from two to one, forming the electrode becomes simple.

Figure 13:
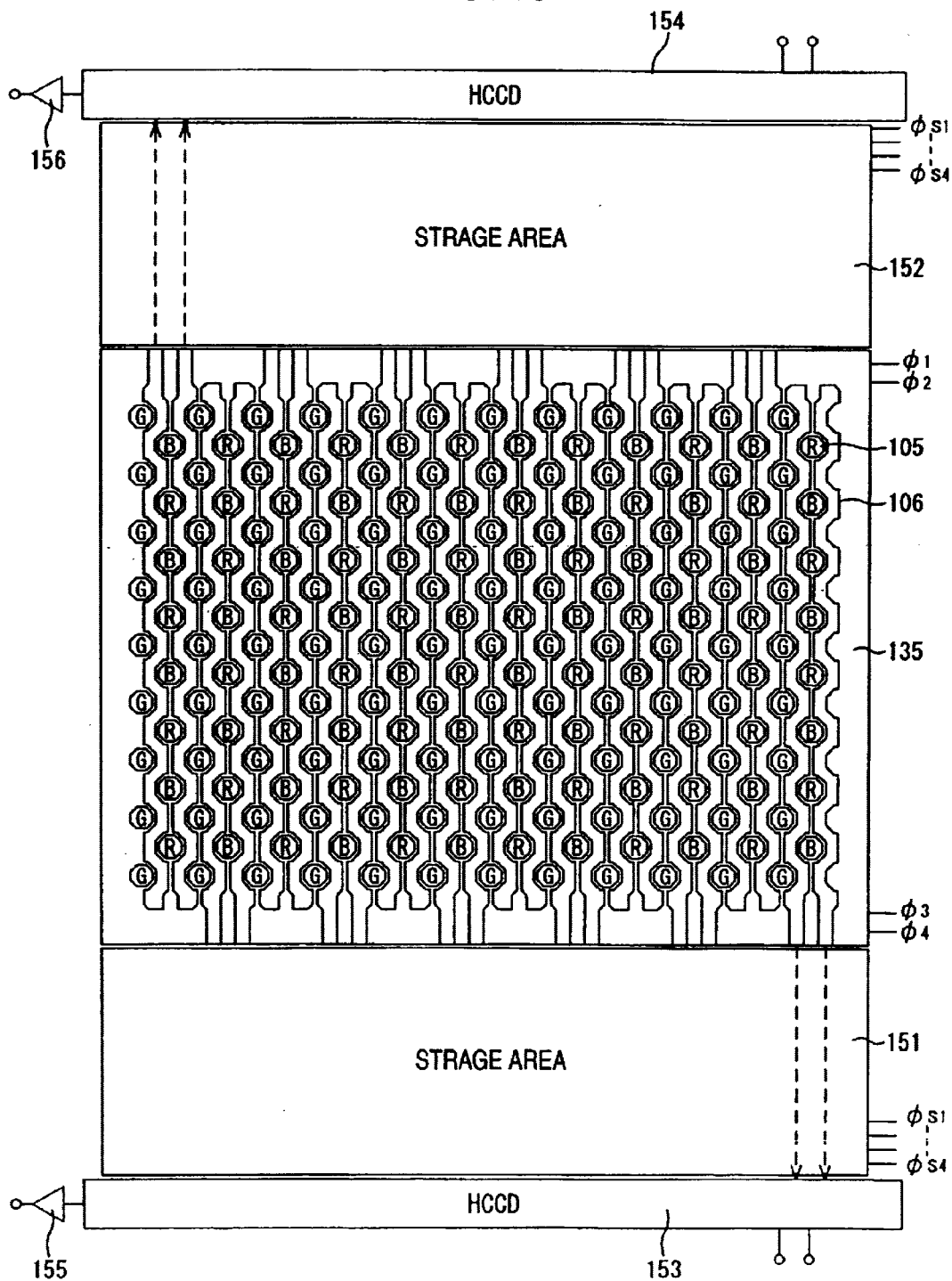
FIG. 13 is a structural illustration showing the overall structure of the solid-state image pick-up apparatus according to the fifth embodiment of the present invention.

FIG. 13 is the structural illustration showing the overall structure of the solid-state image pick-up device according to the fifth embodiment of the present invention. The fifth embodiment shows an example in which the storage area is provided in the same as the second embodiment in addition to the third embodiment or the fourth embodiment, In the upper portion and lower portion of the image pick-up area 135 in which the light receiving portion 105 and the charge transfer path 106 of the VCCD are provided, the light shielded storage areas 151 and 152 are respectively provided, by which structured is the FIT-CCD with all pixel reading-out type honeycomb structure. Each of storage areas 151 and 152 has the charge storage capacity corresponding to, for example, about half of the number of all pixels, respectively light shielded two-phase drive HCCDs 153 and 154 are connected to the ends of these storage areas 151 and 152. Further, the signal reading-out circuits 155 and 156 having the FDA are connected to the ends of respective HCCDs 153 and 154. The structure of the other portion is the same as those from the second to the fourth embodiments.

In this fifth embodiment, in the same as in the third and fourth embodiments, the requirement of the high speed drive of the HCCD is alleviated, and the low consumption power and the high transfer efficiency are obtained. Further, it is appropriate for reading out the interlaced image such as moving image, and in such a case, while reading output from only one side HCCD, and the other side HCCD can be out of operation. In addition to that, even when all pixel read-out type FIT-CCD is structured, the frame interline transfer operation can move the charge from the image pick-up area at high speed and temporarily store the signals in the storage area so that the smear image can be reduced.

As described above, according to the structure of the present embodiment, in the IT-CCD by which all pixels can be read out, even device integration is made high without increasing thickness of the charge transfer electrode formed of double-layered polysilicon electrodes, the equivalent electrical resistance of the charge transfer electrode can be easily lowered. Thereby, the high speed transmission of the charge can be conducted in the VCCD, and the smear characteristic can be improved. Further, since the thickness of the polysilicon electrode, gate oxide film, and oxide film between polysilicon layers, can be reduced, integration of the device, low voltage drive of CCD, low power consumption drive, and high speed drive can be achieved, which can easily cope with the increase of the number of pixels, and increase of the density.

Further, when the charge is transferred alternately in the opposite direction for each predetermined unit of VCCD, the CCD can be structured to be appropriate for the interlace reading-out in the moving image mode,. Further, the drive frequency of the HCCD can be reduced, and the drive with the low power consumption can be obtained.

Figure 14:
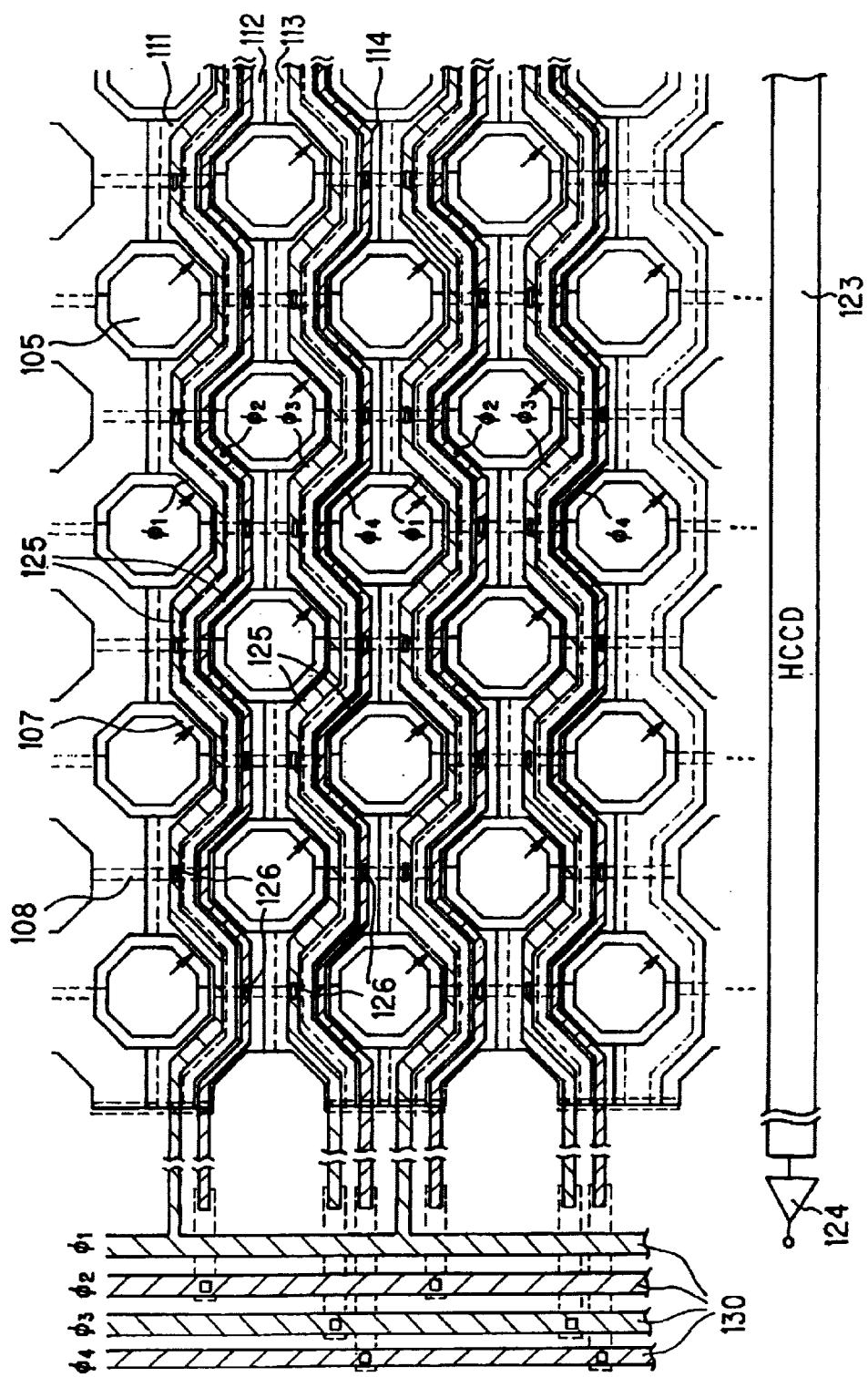
FIG. 14 is a plan view showing the structure of the solid-state image pick-up apparatus according to the sixth embodiment of the present invention.

FIG. 14 is a plan view showing the structure of a solid-state Image pick-up device according to the sixth embodiment of the present invention. In the honeycomb CCD in the present embodiment, as described above, the light receiving portion 105, and vertical charge coupled device (VCCD), comprising the charge transfer path 106 being adjoining thereto and charge transfer electrodes 111–114, are arranged in two-dimensional plane. One horizontal pixel line in the light receiving portion 105 is respectively shifted by half the horizontal pixel pitch in the horizontal line direction to its adjacent pixel line, and one vertical pixel row is arranged by shifting by half the vertical pixel pitch to the adjacent pixel row in the vertical row direction (longitudinal direction), so that so called honeycomb arrangement is structured. In the VCCD, the charge transfer electrodes 111–114 to supply four-phase transfer pulses φ1–φ4 to one pixel are arranged. Each of charge transfer electrodes 111–114 extends in the horizontal line direction (lateral direction) while being formed windingly such that it avoids the light receiving portion 105.

The signal charge generated in the light receiving portion 105 by receiving the incident light is read out onto the charge transfer path 106 from the read-out gate 107 provided in the right lower portion in the view. The charge transfer path 106 adjoining the light receiving portion 105 of each pixel is formed in the longitudinal direction from the upper portion toward the lower portion in the drawing such as to extend windingly between the light receiving portions 105 being arranged honeycomb-like, by which the VCCD together with the charge transfer electrodes 111–114 can be formed. Each end portion of each VCCD is connected to the light shielded horizontal charge transfer portion (HCCD) 123. Further, the signal read-out circuit 124 having the Floating Diffusion Amplifier (FDA) is connected to the end portion of the HCCD 123, from which the signal charge is read out to the outside of the CCD device.

In the present embodiment, in order to reduce the electrical resistance of the polysilicon electrode used as the charge transfer electrodes 111–114 of the VCCD, so called a metal backing structure, which forms metal wiring 125 on the polysilicon electrode with the insulating film in-between, is adopted. The electrode material used for the metal wiring 125 might be such like Al (aluminum) or W(tungsten) and so on, and its resistivity is smaller than that of the polysilicon. This metal wiring 125 is electrically connected to respective charge transfer electrodes 111–114 through the contact hole 126. In the honeycomb CCD as in the present embodiment, which is different from the conventional IT-CCD, the metallic wiring 125 can be arranged such as to extend windingly along the winding ways of the laterally-expanding double-layered structure polysilicon electrodes, to be corresponding to the respective phases (layers) of charge transfer electrodes 111–114.

This metallic wiring 125 is extended to the lateral direction in the view, and the end is electrically connected to the wiring pattern 130 for transmitting the transfer pulses φ1–φ4 for the drive supplied from the device outside. In the example in FIG. 14, the structure in which the metallic wiring 125 and wiring pattern 130 are formed of Al, and a portion at which the metallic wiring 125 and the other phase wiring pattern 130 intersect might be wired by forming the wiring pattern 130 on the polysilicon electrode with the insulating film in-between, and the metallic wiring 125, wiring pattern 130 and polysilicon electrode are electrically conducted by the contact portion.

In this connection, although it is not shown in the drawing, the protective film (flat film) is provided on the surface of the CCD image pick up device of the present embodiment. On this surface protective film, in the same manner as the ITT-CCD image pick-up device, the light shielding film having small optical windows, color filter, and micro lens are formed, and the high sensitive color image pick-up device is thus structured.

In also the conventional IT-CCD, there is an example in which the metallic material is layered as the metal backing structure, however, in the case of the IT-CCD, the spare space is located only at the upper portion of VCCD of the side of the light receiving portion so that the metal wiring can be arranged only in the perpendicular direction to the longitudinal direction of the polysilicon electrode as shown in FIG. 22. Further, in IT-CCD, which is all pixel read-out type, its polysilicon electrode with triple-layered structure makes it difficult for the charge transfer electrodes of three phases to contact with the metal layers thereon to contact and connect to them. In contrast to that, in the present invention, the metal wiring can be extended and provided in the lateral direction along the polysilicon electrode. Further, due to the metal wiring being layered without striding over the other phase's charge transfer electrode (different polysilicon electrode), the generation of the electrical interference or the leaked electrical current which might cause problems to the different phase drive pulse, can be prevented. Accordingly, the position of the contact hole to conduct and electrically connect the polysilicon electrode and the metal wiring can be also placed without any layout restrictions.

As the electrode material, Al, W, Cu (copper), Ti (titan), Co (cobalt), Ni (nickel). Pd (palladium), Pt (platinum), or their nitride (Wsi (tungsten silicon)), silicide (TiSi(titan silicon), alloy, compound, or complex is appropriate. In Al, the processing is easy and easily operated, and because its electrical resistance is small, it is often used for the backing metal wiring. Further, W does not form the alloy to the polysilicon electrode comparing to Al, the potential shift (partial change of the potential) hardly occurs, and in the VCCD, the high efficient charge transfer can be conducted. Further, because W is used for the light shielding film of the IT-CCD, for the metal wiring it may be also used as the light shielding film on the image pick up device.

Having this metal backing structure, the resistance factor of the charge transfer electrode can be lowered without increasing the film thickness of the polysilicon electrode itself. In the conventional CCD, the thickness of the polysilicon electrode might be about 0.4 µm–0.7 µm, however, according to the structure of the present embodiment, even in case of the film thickness of the polysilicon electrode being not larger than 0.25 µm, the normal high speed charge transfer can be performed. When the thickness of the polysilicon electrode is reduced, the etching precision for the electrode formation process can be improved so that its integration can be easily done.

In multi-layer polysilicon CCD having the charge transfer electrode which is made of double-layered or triple-layered polysilicon electrode, the wafer processing such as deposition of the polysilicon film, photo-lithography, and etching, might be repeated at least for the numbers of layers in order to form each polysilicon electrode. In such a case, in order to insulate a polysilicon electrode from each other, the polysilicon surface is theremally oxidized to form the silicon oxide film. Therefore, in the case of CCD, the gate oxide film formed on the silicon substrate surface might be thicker in comparison of the CMOS logic IC. This is for the reason such that, in the etching process of the polysilicon, due to the gate oxide film for protecting the silicon surface being reduced, the gate oxide film should be formed to be thicker beforehand. However, in case of thickness of the gate oxide film being increased, the transfer pulse voltage to be applied on the charge transfer electrode must be set high enough. Accordingly, if the thickness of the polysilicon electrode can be reduced, thickness of the gate oxide film can be relatively reduced, so that the drive voltage of the CCD can be lowered.

Further, since the metal wiring can be set such that the metal wiring does not stride over the other wiring (polysilicon) electrodes, there is no need for providing with the thick interlayer insulating film between the metal wiring and polysilicon electrode. If the metal wiring strides aver the other polysilicon electrodes, for example, the interlayer insulating film of about 0.5–1.0 µm might be necessarily formed. In the present embodiment, however, the insulating film between the metal wiring and the polysilicon electrode is formed of $SiO_2$, and its film thickness can be set no more than 0.2 µm.

Figure 15:
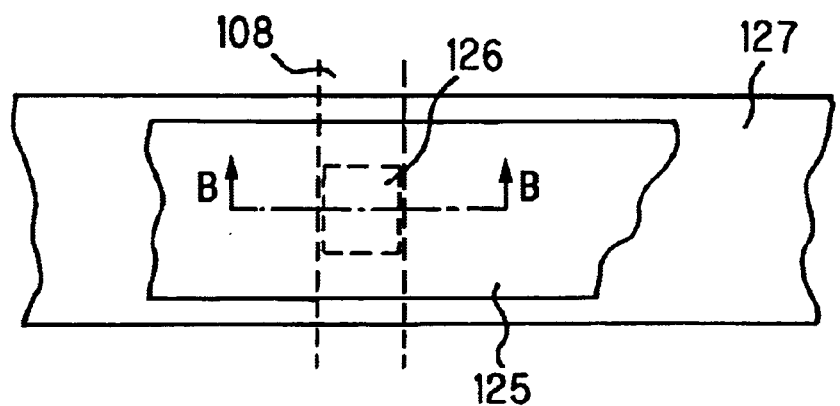
FIGS. 15(A) and 15(B) show the views showing the structure of the contact hole in the sixth embodiment, where (A) is a plan view, and (B) is a B—B sectional view.
Figure 15:
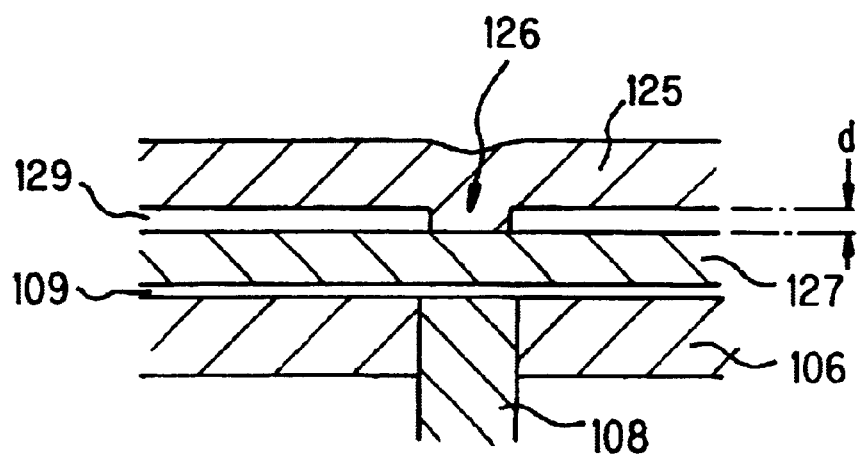

FIG. 15 is a plan view and sectional view showing the structure of the contact hole portion in the sixth embodiment. In the present embodiment, the contact hole 126 is arranged above the channel stopper 108 as a device separation area which isolates the charge transfer paths 106 for the vertical pixel rows. This contact hole electrically connects the polysilicon electrode 127 and the metal wiring 125. The insulating film 129 formed by $SiO_2$ is provided between the metal wiring 125 and the polysilicon electrode 127, of which film thickness d is no more than 0.2 µm. The contact hole 126 passes through this insulating film 129 so that the metal wiring 125 is conducted to the polysilicon electrode 127.

In the honeycomb CCD as in the present embodiment, the polysilicon electrode 127 has a broad open area exposed upwardly by which design space for the positions of the contact hole 126 might be larger than that of IT-CCD, and it can be easily formed on the device separation area. Further, one contact hole 126 can be provided for each pixel in the horizontal line direction (lateral direction) to the alignment of the polysilicon electrode 127 of their respective phases (layers).

In the conventional IT-CCD, due to the contact hole's positioning limitation, such as being limited on the charge transfer path, alloy might be formed between the metal wiring and the polysilicon electrode, which varies the potential between the VCCD electrode and the charge transfer path so that the potential barrier might be produced, which causes troubles to the low charge transfer efficiency. In order to solve this problem, one method is to form the buffer polysilicon or metal between the metal wiring and polysilicon electrode, however, this method results in the complexity of the structure or requirement of the arrangement space. On the contrary, in the present embodiment, forming the contact hole on the device separation area makes it possible to solve such an alloy formation problem without requiring the additional layers or space.

Figure 16:
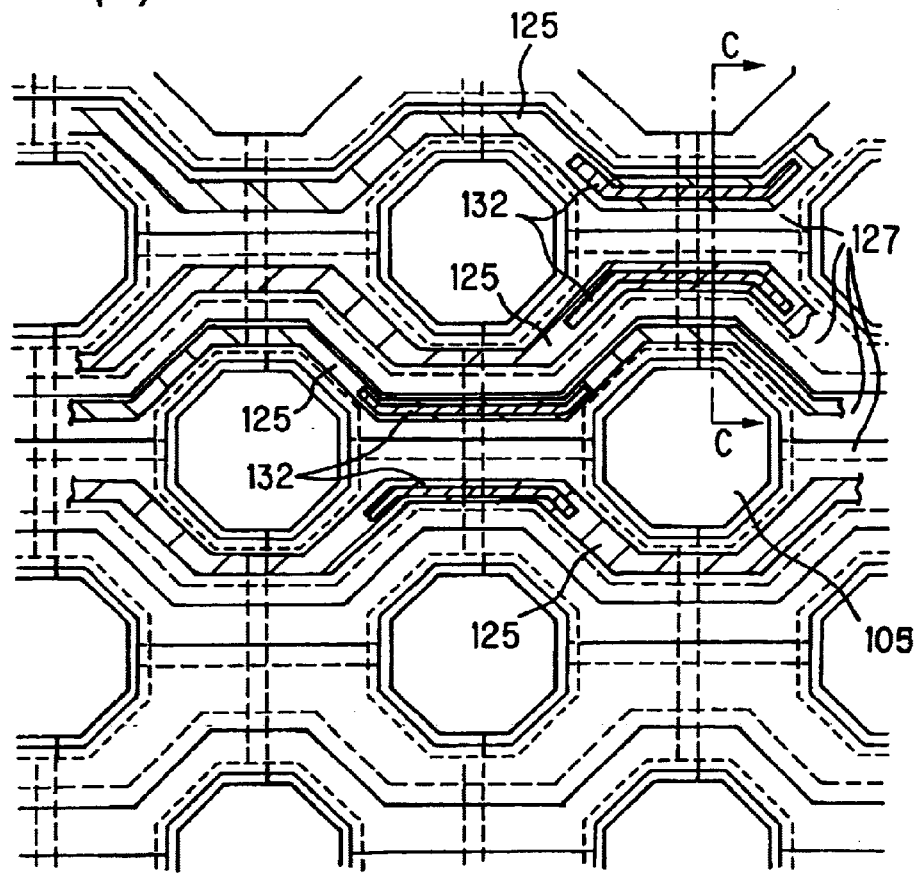
FIGS. 16(A) and 16(B) show the views showing the structure of a main portion of the solid-state image pick-up apparatus according to the seventh embodiment of the present invention, wehre (A) is a plan view, and (B) is a C—C sectional view.
Figure 16:
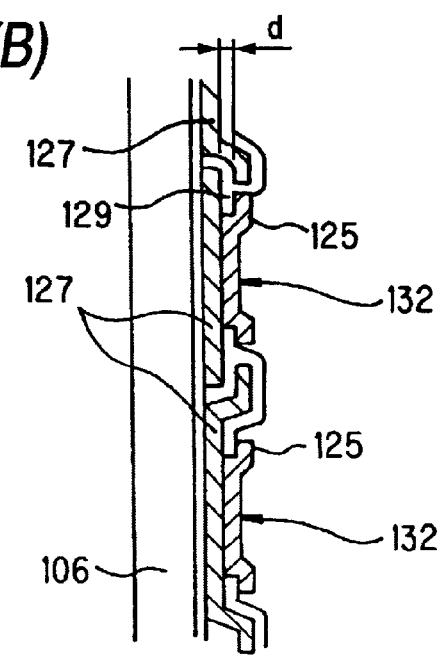

FIG. 16 is a plan view and sectional view showing the structure of the main portion of the solid-state image pick-up device according to the seventh embodiment of the present invention. The seventh embodiment shows another structural example in which the shape of the contact hole portion is changed.

In the same manner as in the sixth embodiment, the double-layered structured polysilicon electrode 127, which is the charge transfer electrode in the honeycomb CCD, is formed to extended windingly in the horizontal line direction (lateral direction) so as to avoid the light receiving portion 105. Then, the metal wiring 125 is arranged corresponding to each phase of charge transfer electrode along the winding way of this laterally-expanding polysilicon electrode, and the metal backing structure is thus formed. The insulating film 129 formed by $SiO_2$ is provided between respective polysilicon electrodes, and on the upper portion of the polysilicon electrode 127. Further, the metal wiring 125 is arranged on its upper portion. The film thickness d of the insulating film 129 between the metal wiring 125 and the polysilicon electrode 127 is no more than 0.2 $\mu$m. FIG. 16 shows the example of the structure in which the metal wiring 125 is formed of W.

In the seventh example, as the contact hole by which the polysilicon electrode 127 and the metal wiring 125 are electrically connected, a contact portion 132 whose shape is rather long is formed to be extended along the polysilicon electrode 127. That is, the contact portion 32 is formed at a predetermined position of the insulating film 129, and by this contact portion 132, the polysilicon electrode 127 and the metal wiring 125 are respectively conducted and electrically connected. In the honeycomb CCD as in the present embodiment, not only the contact hole formed by the small opening, but also the contact area, in which the insulating film such as the oxide film is opened widely, can be formed.

In the metal backing structure, as described above, electric potential difference might be generated between the alloy portion and other than the contact hole formation portion, where the electric potential of alloy is formed between the metallic wiring and the polysilicon electrode. As the result, the potential barrier is formed, which might cause a trouble in the charge transfer process. To the contrary, in the structure of the present embodiment, formation of such alloy can be prevented by using the electrode material for the metal wiring, such as the layered film of W (tungsten), W and WN (tungsten nitride) or W and TiN (titan-nitride). Further, by the long contact portion 132 formed along the metal wiring, the probability of generating defects of the contact (unopened contact hole, for example) can be lowered, and as compared to the case where small contact holes are arranged by the limited number, having the enlarged connection area with the metal wiring, electrical resistance of the polysilicon electrode or the contact portion becomes significantly low.

Figure 17:
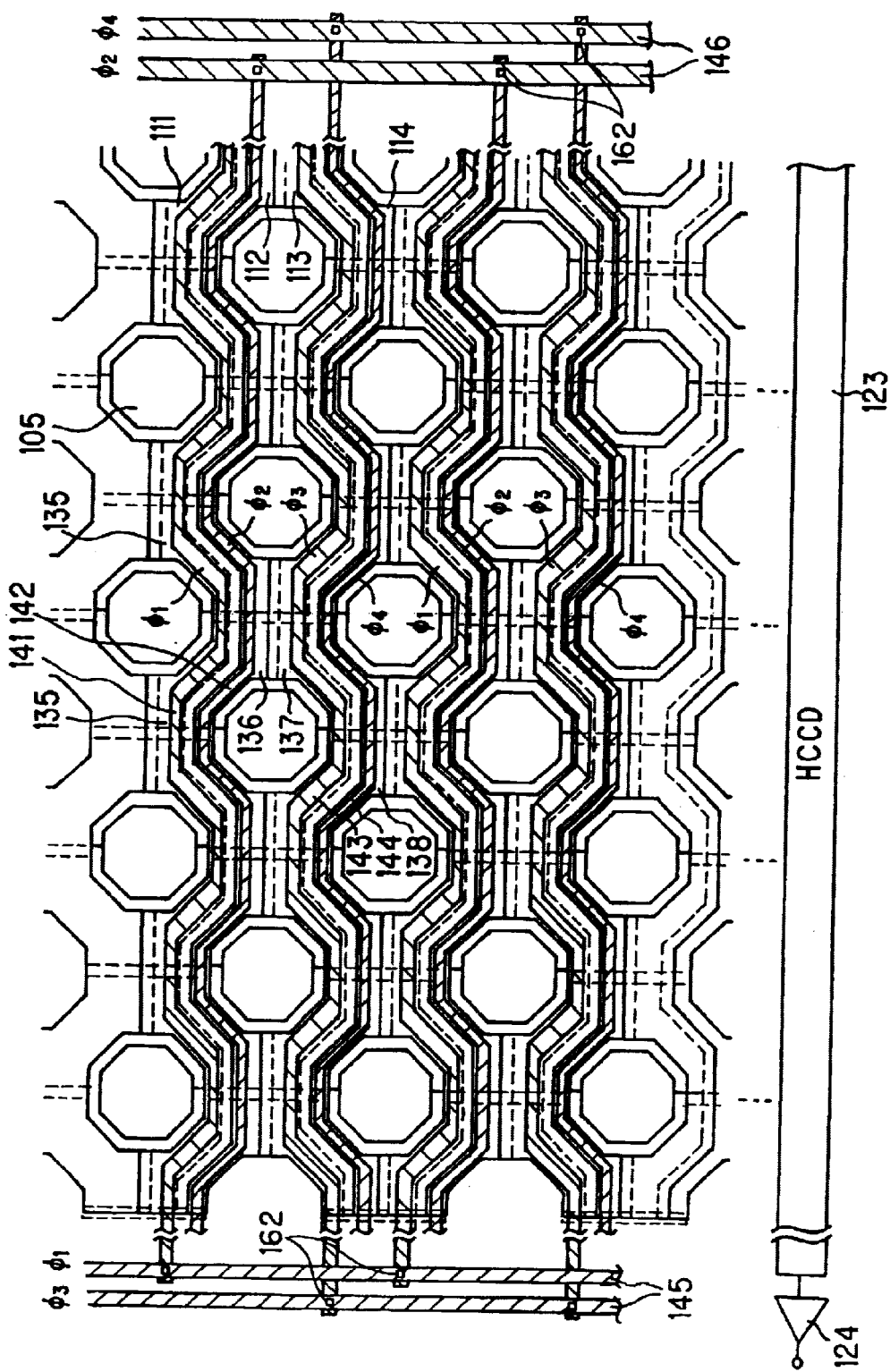
FIG. 17 is a plan view showing the structure of the solid-state image pick-up apparatus according to the eighth embodiment of the present invention.
Figure 18:
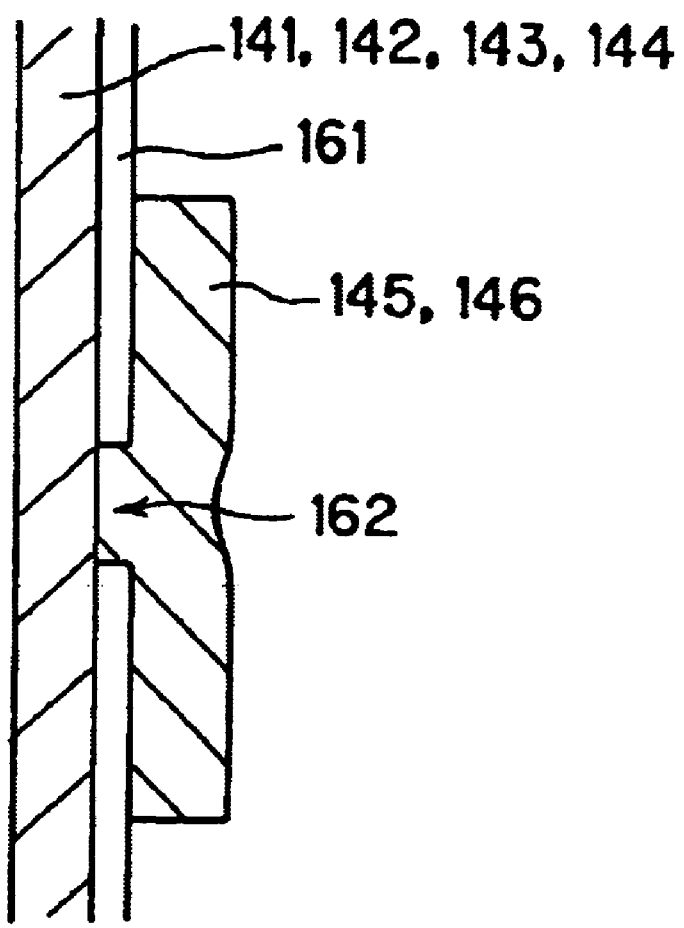
FIG. 18 is a sectional view showing the structure of a contact portion by which a wiring pattern connected to a transfer pulse supply source, and a metallic wiring are electrically connected.

FIG. 17 is a plan view showing the structure of the solid-state image pick-up device according to the eighth embodiment of the present invention, and FIG. 18 is a sectional view showing the structure of the contact portion by which the wiring pattern connected to the transfer pulse supply source and the metal wiring are electrically connected. The eighth embodiment shows another structural example in which the connection path of the end of the metal wiring is changed.

In the same manner as in the sixth embodiment, the metal backing structure is formed in such a manner that the metal wirings 141, 142, 143, 144 are arranged corresponding to each phase of charge transfer electrode along the 2-layer structured polysilicon electrodes 135, 136, 137, 138 which are extended windingly in the horizontal line direction (lateral direction) in the honeycomb CCD. The ends of the metal wirings are respectively electrically connected in the following ways. The metal wirings 141 and 143, which respectively transfer the transfer pulses $\phi1$ and $\phi3$, are extended on the left side of the IT-CCD in the view, and the metal wirings 142 and 144 which respectively transfer the transfer pulses $\phi2$ and $\phi4$, are extended on the right side. Further, these wirings are connected to the wiring patterns 145, 146 in both respective side portions. In the example in FIG. 17, the metal wirings 141–144 are formed by W, and the wiring patterns 145 and 146 are formed of Al. In this case, as shown in FIG. 18, after the metal wirings 141–144 are formed, the insulating film 161 such as the plasma CVD (for example, $SiO_2$) is formed. Then, in order to electrically contact with the wiring patterns 145 and 146, the contact hole 162 is formed. Further, it is structured such that, by forming the wiring patterns 145 and 146 on the insulating film 161, the metal wirings 141–144 and the wiring patterns 145 and 146 are conducted, and the necessary drive pulse can be supplied from the wiring patterns 145 and 146 to the charge transfer electrodes 111–114 of the VCCD. In this regards, it may also be structured such that the ends of the metal wirings 141–144 corresponding to the transfer pulses $\phi1$–$\phi4$ are extended in the both directions of left and right, and lead them out. The other structure is the same as that of the sixth embodiment.

When the metal backing structure is provided in the conventional IT-CCD, as described above, the metal wiring needs to be led-out from the upper portion and connected to the signal source of the transfer pulse because the metal wiring is arranged in the longitudinal direction, the HCCD and others are provided in the lower portion of the light receiving area. To the contrary, in the present embodiment, the ends of the metal wirings 141–144 are split into the left side and right side to lead them out from the both sides of the image pick-up area, and they can be connected to the wiring patterns 145 and 146 for the transfer pulse transmission. That is, the allowance in the design layout of the wiring in the solid-state image pick-up device or the other member becomes high, and as shown in the sixth embodiment, the metal wiring can be also led-out from only single side, and the metal wiring can be also easily and directly led-out from both left and right sides of the image pick-up area. Accordingly, the metal wiring can be freely led out with avoiding the HCCD that is provided in the lower portion of the image pick-up area. Further, in the present embodiment, the peripheral circuits and wiring area except for the image pick-up area might be reduced, and the integration of the device becomes stable.

Figure 19:
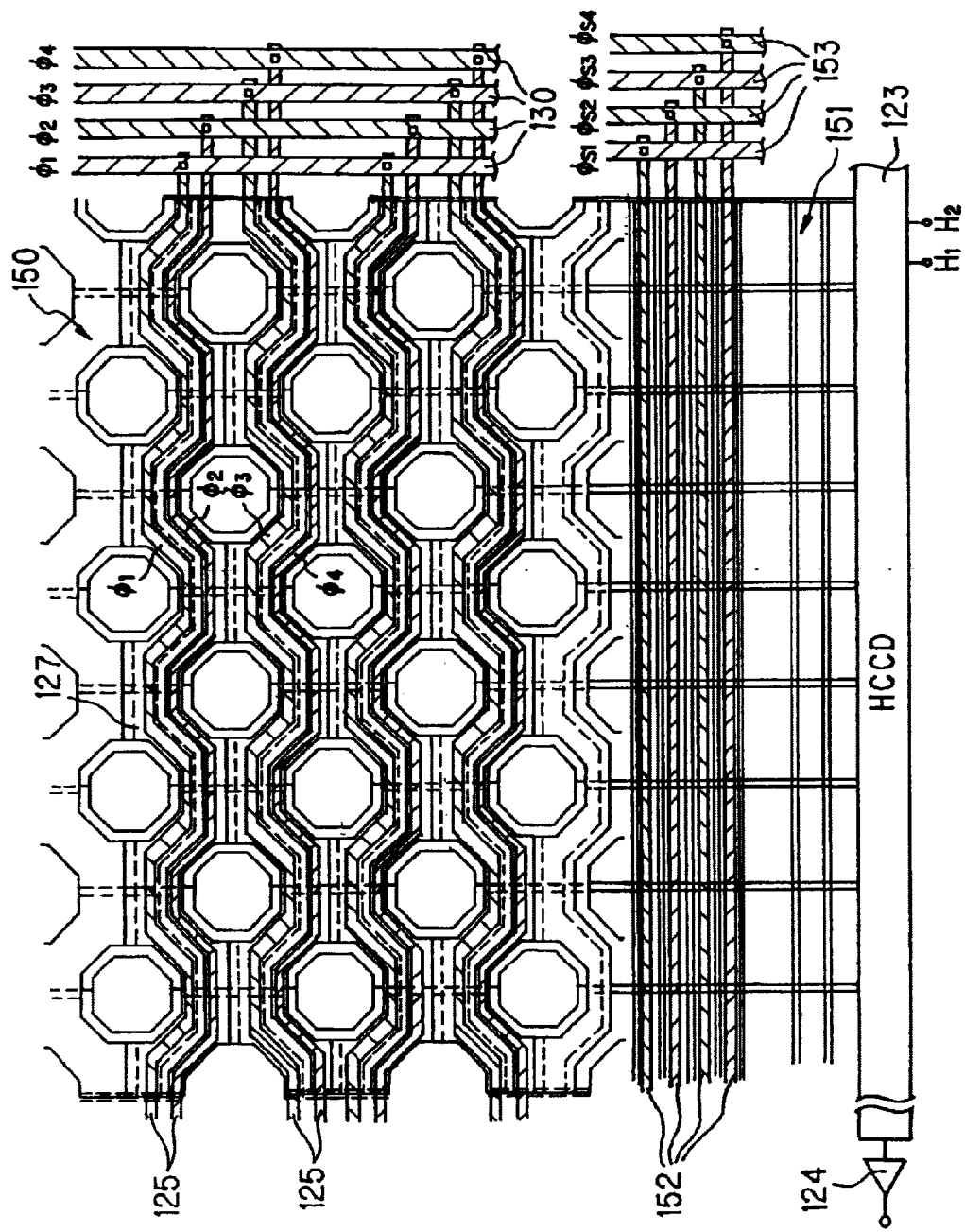
FIG. 19 is a plan view showing the structure of the solid-state image pick-up apparatus according to the ninth embodiment of the present invention.

FIG. 19 is a plan view showing the structure of the solid-state image pick-up device according to the ninth embodiment of the present invention. The ninth embodiment shows an example in which the frame interline transfer type CCD (FIT-CCD) is structured by providing the storage area on one end portion of the image pick-up area in addition to the structure of the sixth embodiment.

In the same manner as in the sixth embodiment, in the honeycomb CCD, the metal wiring 125 is arranged corresponding to each phase of charge transfer electrode along the double-layered structured polysilicon electrode 127 extended zigzagging in the horizontal line direction (lateral direction), and the metal backing structure is formed. The end of this metal wiring 125 is extended in the lateral direction in the view, and the metal wiring 125 is electrically connected to the wiring pattern 130 to transfer the transfer pulses φ1–φ4.

Further, in the lower portion of the image pick-up area 150, the storage area 151 having the light shielded storage portion is provided, and in this storage area 151, the electric charges quickly transferred by the VCCD are temporarily stored, then, they are transferred to the HCCD 123. Also in this storage area 151, in the same manner as the image pick-up area 150, the metal wiring 152 is arranged, and is electrically connected to the wiring pattern 153 to transfer the transfer pulses φs1–φs4. In the example of this FIG. 19, the metal wirings 125 and 152 are formed of W, the wiring patterns 130, and 153 are formed of Al, and the wiring patterns 130 and 153 are formed on the metal wirings 125 and 152 with the insulating film being formed in-between. Further, the metal wirings 125 and 152 and the wiring patterns 130 and 153 are respectively electrically conducted by the contact portion. The other structure is the same as the sixth embodiment.

In the present embodiment, since the high speed drive can be performed by reducing electrical resistance of the charge transfer electrode in the VCCD, the solid-state image pick-up device, which is all pixel read out type, can be easily structured as FIT-CCD by using the honeycomb CCD. In the honeycomb CCD, due to rather large design allowance in the position or the numbers of the contact holes to be formed, as compared to the conventional IT-CCD or FIT-CCD, the area of the contact hole formation portion can be enlarged, and fluctuation of the potential by the high speed transfer pulse becomes small, and the high transfer efficiency can be achieved.

As described above, according to the structure of the present embodiment, in the image pick up device which is all pixel read out type, even when the total number of pixels are increased and their feature size are made smaller, the equivalent electrical resistance of the charge transfer electrode can be easily reduced without increasing the thickness of the charge transfer electrode formed of the double-layered polysilicon. Thereby, in the VCCD, the high speed charge transfer can be realized, and the smear noise can be decreased. Further, the low voltage, low power consumption, and high speed drive of the CCD can be performed, so that is can easily cope with the increase of the numbers of pixels, and the increase of the density. Further, progressive read-out type FIT-CCD can be easily structured, and the high performance CCD can be achieved. Further, because the thickness of the polysilicon electrode, gate oxide film, and polysilicon interlayer oxide film can be reduced, it is appropriate for also the future device integration with smaller feature size.

What is claimed is:

1. A solid-state image pick-up device comprising:
    a plurality of light receiving portions which are arranged in a line direction at a predetermined pitch and in a row direction perpendicular thereto on a semiconductor substrate, said plurality of light receiving portions being arranged such that a pixel, which is corresponding to a light receiving portion, and another pixel, which is adjacent to said pixel and corresponding to another light receiving portion, being relatively shifted by half a pixel pitch in the line direction and the row direction;
    a vertical charge transfer portion having a vertical charge transfer path which adjoins the light receiving portions extending in the row direction, in which the electric charge generated in the light receiving portions is transferred, and charge transfer electrodes composed of polysilicon electrodes extending in the line direction so as to cover the vertical charge transfer path and supply a transfer pulse for controlling a potential of the vertical charge transfer path;
    a metal wiring which is provided corresponding to each electrode in the upper portion of the charge transfer electrodes, said metal wiring extending along the vertical charge transfer portion in the row direction; and
    a contact portion by which each of the polysilicon electrodes and the metal wiring are electrically connected.

2. A solid-state image pick-up device according to claim 1, wherein each of said charge transfer electrodes is composed of double layered polysilicon electrodes.

3. A solid-state image pick-up device according to claim 1, wherein each of said charge transfer electrodes is formed in such a manner that four polysilicon electrodes, corresponding to one light receiving portion, are split into two sets of two polysilicon electrodes so as to surround the light receiving portion, and the metal wiring is provided corresponding to each of the polysilicon electrode.

4. A solid-state image pick-up device according to claim 3, wherein the charge transfer electrodes supply and drive the transfer pulse of 4n phases, said n being an integer larger than 1.

5. A solid-state image pick-up device according to claim 1, wherein, in one end portion of an image pick-up area including the light receiving portion and the vertical charge transfer portion, an storage portion storing the charge transferred from the vertical charge transfer portion is provided.

6. A solid-state image pick-up device according to claim 1, wherein the charge transfer electrodes have a separation portion by which the light receiving portions is electrically separated per one pixel in the line direction thereof, every two sets of the light receiving portions in the row direction being driven independently each other.

7. A solid-state image pick-up device according to claim 1, wherein the charge transfer electrode have a separation portion by which the light receiving portions is electrically separated per two pixels in the line direction thereof, every four sets of the light receiving portions in the row direction being driven independently each other.

8. A solid-state image pick-up device according to claim 6, wherein the metal wiring is connected to one of the charge transfer electrodes in such a manner that the transfer pulse to transfer the charge in a direction in the vertical charge transfer portion is supplied for a corresponding set of the row-aligned light receiving portions, wherein said direction is opposite in an adjacent set of the row-aligned light receiving portions that is separated by the separation portion.

9. A solid-state image pick-up device according to claim 8, wherein storage portions storing a respective charge transferred by the vertical charge transfer portion are provided on both end portions of the image pick-up area including the light receiving portion and the vertical charge transfer portion.

10. A solid-state image pick-up device according to claim 9, wherein the metal wiring is structured by the same wiring material so that the vertical charge transfer portion is driven by the same transfer pulse in the image pick-up area and the storage portion.

11. A solid-state image pick-up device comprising:

a plurality of light receiving portions which are arranged in a line direction at a predetermined pitch and in a row direction perpendicular thereto on a semiconductor substrate, said plurality of light receiving portions being arranged such that a pixel, which is corresponding to a light receiving portion, and another pixel, which is adjacent to said pixel and corresponding to another light receiving portion, being relatively shifted by half a pixel pitch in the line direction and the row direction;

a vertical charge transfer portion having a vertical charge transfer path which adjoins the light receiving portions extending in the row direction, in which the electric charge generated in the light receiving portions is transferred, and charge transfer electrodes composed of polysilicon electrodes extending in the line direction so as to cover the vertical charge transfer path and supply a transfer pulse for controlling a potential of the vertical charge transfer path;

a metal wiring which is provided corresponding to each electrode in the upper portion of the charge transfer electrodes, said metal wiring extending along the charge transfer electrodes in the line direction; and a contact portion by which each of the polysilicon electrodes and the metal wiring are electrically connected.

12. A solid-state image pick-up device according to claim 11, wherein each of said charge transfer electrodes is formed in such a manner that four polysilicon electrodes, corresponding to one light receiving portion, are split into two sets of two polysilicon electrodes so as to surround the light receiving portion, and the metal wiring is provided corresponding to each of the polysilicon electrode.

13. A solid-state image pick-up device according to claim 11, wherein the contact portion is formed in an area along the metal wiring or the polysilicon electrodes.

14. A solid-state image pick-up device according to claim 11, wherein the contact portion is formed above a device isolation area by which the adjoining vertical charge transfer paths are isolated.

15. A solid-state image pick-up device according to claim 11, wherein the metal wiring is structured in such a manner that it extends to at least one direction of the extended line direction, and a plurality of metal wirings are extended to both directions of the line direction, where they are connected to a supply source of the transfer pulse.

16. A solid-state image pick-up device according to claim 11, wherein storage portions storing a respective charge transferred by the vertical charge transfer portion are provided on at least one of end portions of the image pick-up area including the light receiving portion and the vertical charge transfer portion.

17. A solid-state image pick-up device according to claim 11, wherein an insulating film is provided between the polysilicon electrode and the metal wiring, thickness of the insulating film being no more than 0.2 $\mu$m.

18. A solid-state image pick-up device according to claim 1, wherein thickness of the polysilicon electrode is no more than 0.25 $\mu$m.

19. A solid-state image pick-up device according to claim 1, wherein the metal wiring is structured by Al, W, Cu, Ti, Ni, Pd, Pt, or nitride of them, silicide, alloy, compound, or complex.

20. A solid-state image pick-up device according to claim 18, wherein the metal wiring is structured by Al, W, Cu, Ti, Co, Ni, Pd, Pt, or nitride of them, silicide, alloy, compound, or complex.

* * * * *